(12) United States Patent
Kyung et al.

(10) Patent No.: US 7,526,717 B2
(45) Date of Patent: *Apr. 28, 2009

(54) APPARATUS AND METHOD FOR CODING AND DECODING SEMI-SYSTEMATIC BLOCK LOW DENSITY PARITY CHECK CODES

(75) Inventors: Gyu-Bum Kyung, Suwon-si (KR);
Se-Ho Myung, Pohang-si (KR);
Kyeong-Cheol Yang, Pohang-si (KR);
Hyun-Gu Yang, Pohang-si (KR);
Dong-Seek Park, Yongin-si (KR);
Hong-Sil Jeong, Suwon-si (KR);
Jae-Yoel Kim, Gupo-si (KR)

(73) Assignees: Samsung Electronics Co., Ltd. (KR);
Postech Academy Industry Foundation (KR)

(*) Notice: Subject to any disclaimer, the term of this patent is extended or adjusted under 35 U.S.C. 154(b) by 538 days.

This patent is subject to a terminal disclaimer.

(21) Appl. No.: 11/154,771

(22) Filed: Jun. 16, 2005

(65) Prior Publication Data

US 2005/0283709 A1 Dec. 22, 2005

(30) Foreign Application Priority Data

Jun. 16, 2004 (KR) .................... 10-2004-0044733

(51) Int. Cl.
*G06F 11/00* (2006.01)
*H03M 13/03* (2006.01)

(52) U.S. Cl. ....................... 714/800; 714/790

(58) Field of Classification Search ......... 714/800–801, 714/803, 807
See application file for complete search history.

(56) References Cited

U.S. PATENT DOCUMENTS

2005/0180525 A1* 8/2005 Hansen et al. .............. 375/295

OTHER PUBLICATIONS

Konrad R. Fialkowski, THe 2's complement and other Semi-Systematic binary codes, Aug. 1966, IEEE Trans on Electronic computers, vol. EC-15, No. 4, p. 603-605.*

* cited by examiner

*Primary Examiner*—Shelly A Chase
(74) *Attorney, Agent, or Firm*—The Farrell Law Firm, PC

(57) ABSTRACT

An apparatus and method for coding a semi-systematic block low density parity check (LDPC) code in which an information word is received and coded into a codeword including the information word, a first parity, a second parity, and a third parity, based on one of a first parity check matrix and a second parity check matrix, depending on a size to be applied when generating the information word into a semi-systematic block LDPC code. A part having a degree being at least equal to a predetermined degree is punctured from the information word, generating the semi-systematic block LDPC code. The semi-systematic block LDPC code includes the information word, the part of which was punctured, the first parity, the second parity, and the third parity.

53 Claims, 14 Drawing Sheets

| $P^a{}_{11}$ | $P^a{}_{12}$ | $P^a{}_{13}$ | $P^a{}_{14}$ | ... | $P^a{}_{1(q-1)}$ | $P^a{}_{1q}$ |
|---|---|---|---|---|---|---|
| $P^a{}_{21}$ | $P^a{}_{22}$ | $P^a{}_{23}$ | $P^a{}_{24}$ | ... | $P^a{}_{2(q-1)}$ | $P^a{}_{2q}$ |
| $P^a{}_{31}$ | $P^a{}_{32}$ | $P^a{}_{33}$ | $P^a{}_{34}$ | ... | $P^a{}_{3(q-1)}$ | $P^a{}_{3q}$ |
| ⋮ | ⋮ | ⋮ | ⋮ | ... | ⋮ | ⋮ |
| $P^a{}_{p1}$ | $P^a{}_{p2}$ | $P^a{}_{p3}$ | $P^a{}_{p4}$ | ... | $P^a{}_{p(q-1)}$ | $P^a{}_{pq}$ |

FIG.4
(PRIOR ART)

$$P = \begin{bmatrix} 0 & 1 & 0 & & 0 \\ 0 & 0 & 1 & \cdots & 0 \\ \vdots & \vdots & \vdots & & \vdots \\ 0 & 0 & 0 & \cdots & 1 \\ 1 & 0 & 0 & & 0 \end{bmatrix}$$

| | | | INFORMATION PART | | | | | | $P^{a_1}$ | 1 | 0 | 0 | ... | 0 | |
|---|---|---|---|---|---|---|---|---|---|---|---|---|---|---|---|
| $P^{a_{11}}$ | $P^{a_{12}}$ | $P^{a_{13}}$ | $P^{a_{14}}$ | ... | $P^{a_{1(n-1)}}$ | $P^{a_{1n}}$ | | | | | | | | | |
| $P^{a_{21}}$ | $P^{a_{22}}$ | $P^{a_{23}}$ | $P^{a_{24}}$ | ... | $P^{a_{2(n-1)}}$ | $P^{a_{2n}}$ | | ... | ... | $P^{a_2}$ | 0 | 1 | 0 | ... | |
| $P^{a_{31}}$ | $P^{a_{32}}$ | $P^{a_{33}}$ | $P^{a_{34}}$ | ... | $P^{a_{3(n-1)}}$ | $P^{a_{3n}}$ | | | | $P^y$ | 0 | $P^{a_3}$ | 1 | 0 | PARITY PART |
| ... | ... | ... | ... | ... | ... | ... | | | | ... | ... | ... | ... | ... | |
| $P^{a_{m1}}$ | $P^{a_{m2}}$ | $P^{a_{m3}}$ | $P^{a_{m4}}$ | ... | $P^{a_{m(n-1)}}$ | $P^{a_{mn}}$ | | | | $P^x$ | 0 | 0 | 0 | $P^{a_m}$ | |

$$B^T = \begin{bmatrix} p^{a_1} & 0 & \cdots & p^\gamma & \cdots & 0 & 0 \end{bmatrix}$$

$$T = \begin{bmatrix} 1 & 0 & 0 & & 0 & 1 \\ p^{a_2} & 1 & 0 & & 1 & 0 \\ 0 & p^{a_3} & 1 & \cdots & 0 & 0 \\ \vdots & \vdots & \vdots & & \vdots & \vdots \\ 0 & 0 & 0 & & p^{a_{m-2}} & 0 \\ 0 & 0 & 0 & & 1 & p^{a_{m-1}} \\ 0 & 0 & 0 & & 0 & 1 \end{bmatrix}$$

$$E = \begin{bmatrix} 0 & 0 & \cdots & 0 & 0 & 0 & p^{a_m} \end{bmatrix}$$

$$T^{-1} = \begin{bmatrix} 1 & 0 & 0 & & 0 & 0 & 1 \\ p^{a_2} & 1 & 0 & & 0 & 1 & 0 \\ p^{2\sim 3} & p^{a_3} & 1 & \cdots & 1 & 0 & 0 \\ \vdots & \vdots & \vdots & & \vdots & \vdots & \vdots \\ p^{2\sim(m-2)} & p^{3\sim(m-2)} & p^{4\sim(m-2)} & & p^{a_{m-2}} & 0 & 0 \\ p^{2\sim(m-1)} & p^{3\sim(m-1)} & p^{4\sim(m-1)} & & p^{(m-2)(m-1)} & p^{a_{m-1}} & 0 \end{bmatrix}$$

FIG. 9
(PRIOR ART)

APPARATUS AND METHOD FOR CODING AND DECODING SEMI-SYSTEMATIC BLOCK LOW DENSITY PARITY CHECK CODES

PRIORITY

This application claims priority under 35 U.S.C. § 119(a) to an application entitled "Apparatus and Method for Coding/Decoding Semi-Systematic Block Low Density Parity Check Code" filed in the Korean Intellectual Property Office on Jun. 16, 2004 and assigned Serial No. 2004-44733, the contents of which are incorporated herein by reference.

BACKGROUND OF THE INVENTION

1. Field of the Invention

The present invention relates generally to a mobile communication system, and in particular, to an apparatus and method for coding and decoding semi-systematic block Low Density Parity Check (LDPC) codes.

2. Description of the Related Art

In communications, the most essential task is to efficiently and reliably transmit data over a channel. The next generation multimedia mobile communication system, currently under active research, requires a high-speed communication system capable of processing and transmitting different types of information, such as image and radio data, beyond the early voice-oriented service. Therefore, it is essential to increase system efficiency using a channel coding scheme appropriate for the system.

However, transmission data inevitably suffers errors due to noise, interference, and fading according to channel conditions, causing a loss of a great amount of information. In order to reduce the loss of the information, various error control schemes are currently in use and are based in part on channel characteristics to thereby improve the reliability of the mobile communication system. The most basic one of the error control schemes uses error correction codes.

FIG. 1 is a diagram illustrating a transceiver in a conventional mobile communication system. Referring to FIG. 1, a transmitter 100 includes an encoder 111, a modulator 113, and a radio frequency (RF) processor 115, and a receiver 150 includes an RF processor 151, a demodulator 153, and a decoder 155.

In the transmitter 100, transmission information data 'u' is generated and delivered to the encoder 111. The encoder 111 generates a coded symbol 'c' by coding the information data 'u' with a predetermined coding scheme, and outputs the coded symbol 'c' to the modulator 113. The modulator 113 generates a modulation symbol 's' by modulating the coded symbol 'c' with a predetermined modulation scheme, and outputs the modulation symbol 's' to the RF processor 115. The RF processor 115 RF-processes the modulation symbol 's' output from the modulator 113, and transmits the RF-processed signal via an antenna ANT.

The signal transmitted by the transmitter 100 is received at the receiver 150 via its antenna ANT, and then delivered to the RF processor 151. The RF processor 151 RF-processes the received signal, and outputs the RF-processed signal 'r' to the demodulator 153. The demodulator 153 demodulates the RF-processed signal 'r' output from the RF processor 151 using a demodulation scheme corresponding to the modulation scheme applied in the modulator 113, and outputs the demodulated signal 'x' to the decoder 155. The decoder 155 decodes the demodulated signal 'x' output from the demodulator 153 using a decoding scheme corresponding to the coding scheme applied in the encoder 111, and finally outputs the decoded signal 'û' as restored information data. In order for the receiver 150 to decode the information data 'u' without errors, transmitted by the transmitter 100, there is a need for a high-performance encoder and decoder. Particularly, because a radio channel environment should be taken into consideration because of the characteristics of a mobile communication system, errors that can be generated due to the radio channel environment should be considered more seriously.

As described above, the error control scheme uses error correction codes, and the most typical error correction codes include turbo codes and low-density parity check (LDPC) codes.

It is well known that, during high-speed data transmission, the turbo code is superior in performance gain to a convolutional code that is conventionally used for error correction. The turbo code is advantageous in that it can efficiently correct an error caused by noise generated in a transmission channel, thereby increasing the reliability of the data transmission. The LDPC code can be decoded using an iterative decoding algorithm base on a sum-product algorithm in a factor graph. Because a decoder for the LDPC code uses the sum-product algorithm-based iterative decoding algorithm, it is less complex than a decoder for the turbo code. In addition, the decoder for the LDPC code is easily implemented with a parallel processing decoder, compared with the decoder for the turbo code.

Shannon's channel coding theorem shows that reliable communication is possible only at a data rate not exceeding a channel capacity. However, Shannon's channel coding theorem has proposed no detailed channel coding and decoding method for supporting a data rate up to the maximum channel capacity limit. Generally, although a random code having a very large block size exhibits a performance approximating a channel capacity limit of Shannon's channel coding theorem, when a MAP (Maximum A Posteriori) or ML (Maximum Likelihood) decoding method is used, it is actually impossible to implement the decoding method because of its heavy calculation load.

The turbo code was proposed by Berrou, Glavieux, and Thitimajshima in 1993, and exhibits a superior performance that approximates a channel capacity limit of Shannon's channel coding theorem. The proposal of the turbo code triggered active research on iterative decoding and graphical expression of codes. Further, LDPC codes proposed by Gallager in 1962 have been newly spotlighted in the research.

Cycles exist in a factor graph of the turbo code and the LDPC code, and it is well known that iterative decoding in the factor graph of the LDPC code, where cycles exist, is suboptimal. Also, it has been experimentally proven that the LDPC code has excellent performance through iterative decoding. The LDPC code known to have the highest performance ever, exhibits performances having a difference of only about 0.04 [dB] at a channel capacity limit of Shannon's channel coding theorem at a bit error rate (BER) $10^{-5}$, using a block size $10^7$.

In addition, although an LDPC code defined in Galois Field (GF) with q>2, i.e., GF(q), increases in complexity in its decoding process, it is much superior in performance to a binary code. However, there is no satisfactory theoretical description of successful decoding by an iterative decoding algorithm for the LDPC code defined in GF(q).

The LDPC code, proposed by Gallager, is defined by a parity check matrix in which major elements have a value of 0 and minor elements, except the elements having the value of 0, have a non-zero value, e.g., a value of 1. In the following description, it will be assumed that a non-zero value is a value of 1. For example, an (N, j, k) LDPC code is a linear block code having a block size N, and is defined by a sparse parity check matrix in which each column has j elements having a value of 1, each row has k elements having a value of 1, and all of the elements, except for the elements having the value of 1, have a value of 0.

An LDPC code in which a weight of each column in the parity check matrix is fixed to 'j' and a weight of each row in the parity check matrix is fixed to 'k', is called a "regular LDPC code." Herein, the "weight" refers to the number of elements having a non-zero value among the elements included in the parity check matrix.

Unlike the regular LDPC code, an LDPC code in which the weight of each column in the parity check matrix and the weight of each row in the parity check matrix are not fixed is called an "irregular LDPC code." It is generally known that the irregular LDPC code is superior in performance to the regular LDPC code. However, using the irregular LDPC code, because the weight of each column and the weight of each row in the parity check matrix are not fixed, i.e., are irregular, the weight of each column in the parity check matrix and the weight of each row in the parity check matrix must be properly adjusted in order to guarantee the superior performance.

FIG. 2 is a diagram illustrating a parity check matrix of a conventional (8, 2, 4) LDPC code. Referring to FIG. 2, a parity check matrix H of the (8, 2, 4) LDPC code includes 8 columns and 4 rows, wherein a weight of each column is fixed to 2 and a weight of each row is fixed to 4. Because the weight of each column and the weight of each row in the parity check matrix are regular as stated above, the (8, 2, 4) LDPC code illustrated in FIG. 2 is a regular LDPC code.

FIG. 3 is a diagram illustrating a factor graph of the (8, 2, 4) LDPC code illustrated in FIG. 2. Referring to FIG. 3, a factor graph of the (8, 2, 4) LDPC code includes 8 variable nodes of $x_1$ 300, $x_2$ 302, $x_3$ 304, $x_4$ 306, $x_5$ 308, $x_6$ 310, $x_7$ 312, and $x_8$ 314, and 4 check nodes 316, 318, 320, and 322. When an element having a value of 1, i.e., a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight, it is possible to perform iterative decoding even in a block code having a relatively large size, that exhibits performance approximating a channel capacity limit of Shannon's channel coding theorem, such as a turbo code, while continuously increasing a block size of the block code. MacKay and Neal have proven that an iterative decoding process of an LDPC code using a flow transfer scheme approximates an iterative decoding process of a turbo code in performance.

In order to generate a high-performance LDPC code, the following conditions should be satisfied.

(1) Cycles in a factor graph of an LDPC code should be considered.

The term "cycle" refers to a loop formed by the edges connecting the variable nodes to the check nodes in a factor graph of an LDPC code, and a length of the cycle is defined as the number of edges constituting the loop. A long cycle indicates that the number of edges connecting the variable nodes to the check nodes constituting the loop in the factor graph of the LDPC code is large. In contrast, a short cycle indicates that the number of edges connecting the variable nodes to the check nodes constituting the loop in the factor graph of the LDPC code is small.

As cycles in the factor graph of the LDPC code become longer, the performance efficiency of the LDPC code increases. That is, when long cycles are generated in the factor graph of the LDPC code, it is possible to prevent performance degradation such as an error floor occurring when too many cycles with a short length exist in the factor graph of the LDPC code.

(2) Efficient coding of an LDPC code should be considered.

It is difficult for the LDPC code to undergo real-time coding compared with a convolutional code or a turbo code because of its high coding complexity. In order to reduce the coding complexity of the LDPC code, a Repeat Accumulate (RA) code has been proposed. However, the RA code also has a limitation in reducing the coding complexity of the LDPC code. Therefore, efficient coding of the LDPC code should be taken into consideration.

(3) Degree distribution in a factor graph of an LDPC code should be considered.

Generally, an irregular LDPC code is superior in performance to a regular LDPC code, because a factor graph of the irregular LDPC code has various degrees. The term "degree" refers to the number of edges connected to the variable nodes and the check nodes in the factor graph of the LDPC code. Further, the phrase "degree distribution" in a factor graph of an LDPC code refers to a ratio of the number of nodes having a particular degree to the total number of nodes. It has been proven by Richardson that an LDPC code having a particular degree distribution is superior in performance.

FIG. 4 is a diagram illustrating a parity check matrix of a conventional block LDPC code. Before a description of FIG. 4 is given, it should be noted that the block LDPC code is a new LDPC code for which efficient coding, efficient storage, and performance improvement of a parity check matrix were considered, and the block LDPC code is an LDPC code extended by generalizing a structure of a regular LDPC code.

Referring to FIG. 4, a parity check matrix of the block LDPC code is divided into a plurality of partial blocks, and a permutation matrix is mapped to each of the partial blocks. In FIG. 4, 'P' represents a permutation matrix having an $N_s \times N_s$ size, and a superscript (or exponent) $a_{pq}$ of the permutation matrix P is either $0 \leq a_{pq} \leq N_s - 1$ or $a_{pq} = \infty$. In addition, 'p' indicates that a corresponding permutation matrix is located in the $p^{th}$ row of the partial blocks of the parity check matrix, and 'q' indicates that a corresponding permutation matrix is located in the $q^{th}$ column of the partial blocks of the parity check matrix. That is, $P^{a_{pq}}$ represents a permutation matrix located in a partial block, where the $p^{th}$ row and the $q^{th}$ column of the parity check matrix including a plurality of partial blocks cross each other. That is, the 'p' and the 'q' represent the number of rows and the number of columns of partial blocks mapped to an information part in the parity check matrix, respectively.

FIG. 5 is a diagram illustrating the permutation matrix P of FIG. 4. As illustrated in FIG. 5, the permutation matrix P is a square matrix having an $N_s \times N_s$ size, and each of $N_s$ columns included in the permutation matrix P has a weight of 1 and each of $N_s$ rows included in the permutation matrix P also has a weight of 1. Herein, although a size of the permutation matrix P is expressed as $N_s \times N_s$, it will also be expressed as $N_s$ because the permutation matrix P is a square matrix.

In FIG. 4, a permutation matrix P with a superscript $a_{pq}=0$, i.e., a permutation matrix $P^0$, represents an identity matrix $I_{N_s \times N_s}$, and a permutation matrix P with a superscript $a_{pq}=\infty$, i.e., a permutation matrix $P^\infty$, represents a zero matrix. Herein, $I_{N_s \times N_s}$ represents an identity matrix with a size $N_s \times N_s$.

In the entire parity check matrix of the block LDPC code illustrated in FIG. 4, because the total number of rows is $N_s \times p$ and the total number of columns is $N_s \times q$ (for $p \leq q$), when the entire parity check matrix of the LDPC code has a full rank, a coding rate can be expressed as shown in Equation (1), regardless of a size of the partial blocks.

$$R = \frac{N_s \times q - N_s \times p}{N_s \times q} = \frac{q-p}{q} = 1 - \frac{p}{q} \qquad (1)$$

If $a_{pq} \neq \infty$ for all p and q, the permutation matrices corresponding to the partial blocks are not zero matrices, and the partial blocks constitute a regular LDPC code in which the weight value of each column and the weight value of each row in each of the permutation matrices corresponding to the partial blocks are p and q, respectively. Herein, each of permutation matrices corresponding to the partial blocks will be referred to as a "partial matrix."

Because (p−1) dependent rows exist in the entire parity check matrix, a coding rate is greater than the coding rate calculated by Equation (1). In the case of the block LDPC code, if a weight position of a first row of each of the partial matrices included in the entire parity check matrix is determined, the weight positions of the remaining ($N_s$−1) rows can be determined. Therefore, the required size of a memory is reduced to $1/N_s$ as compared with the case in which the weights are irregularly selected to store information on the entire parity check matrix.

As described above, the term "cycle" refers to a loop formed by the edges connecting the variable nodes to the check nodes in a factor graph of an LDPC code, and a length of the cycle is defined as the number of edges constituting the loop. A long cycle indicates that the number of edges connecting the variable nodes to the check nodes constituting the loop in the factor graph of the LDPC code is large. As cycles in the factor graph of the LDPC code become longer, the performance efficiency of the LDPC code increases. However, as cycles in the factor graph of the LDPC code become shorter, an error correction capability of the LDPC code decreases because performance degradation such as an error floor occurs. That is, when there are many cycles with a short length in a factor graph of the LDPC code, information on a particular node belonging to the cycle with a short length, starting therefrom, returns after a small number of iterations. As the number of iterations increases, the information returns to the corresponding node more frequently, such that the information cannot be correctly updated, thereby deteriorating an error correction capability of the LDPC code.

FIG. 6 is a diagram illustrating a cycle structure of a block LDPC code of which a parity check matrix includes 4 partial matrices. However, before a description of FIG. 6 is given, it should be noted that the block LDPC code is a new LDPC code for which efficient coding, efficient storage, and performance improvement of a parity check matrix were considered. The block LDPC code is also an LDPC code extended by generalizing a structure of a regular LDPC code.

A parity check matrix of the block LDPC code illustrated in FIG. 6 includes 4 partial blocks. Further, a diagonal line represents a position where the elements having a value of 1 are located, and the portions other than the diagonal-lined portions represent positions where the elements having a value of 0 are located. In addition, 'P' represents the same permutation matrix as the permutation matrix described in conjunction with FIG. 5.

In order to analyze a cycle structure of the block LDPC code illustrated in FIG. 6, an element having a value of 1 located in an $i^{th}$ row of a partial matrix $P^a$ is defined as a reference element, and an element having a value of 1 located in the $i^{th}$ row will be referred to as a "0-point." Herein, "partial matrix" will refer to a matrix corresponding to the partial block. The 0-point is located in an $(i+a)^{th}$ column of the partial matrix $P^a$.

An element having a value of 1 in a partial matrix $P^b$, located in the same row as the 0-point, will be referred to as a "1-point." Accordingly, the 1-point is located in an $(i+b)^{th}$ column of the partial matrix $P^b$.

An element having a value of 1 in a partial matrix $P^c$, located in the same column as the 1-point, will be referred to as a "2-point." Because the partial matrix $P^c$ is a matrix acquired by shifting respective columns of an identity matrix I to the right with respect to a modulo $N_s$ by c, the 2-point is located in an $(i+b-c)^{th}$ row of the partial matrix $P^c$. In addition, an element having a value of 1 in a partial matrix $P^d$, located in the same row as the 2-point, will be referred to as a "3-point." The 3-point is located in an $(i+b-c+d)^{th}$ column of the partial matrix $P^d$. An element having a value of 1 in the partial matrix $P^a$, located in the same column as the 3-point, will be referred to as a "4-point." The 4-point is located in an $(i+b-c+d-a)^{th}$ row of the partial matrix $P^a$.

In the cycle structure of the LDPC code illustrated in FIG. 6, if a cycle with a length of 4 exists, the 0-point and the 4-point are located in the same position. That is, a relation between the 0-point and the 4-point is defined by Equation (2).

$$i \equiv i+b-c+d-a (\text{mod} N_s) \text{ or } i+a \equiv i+b-c+d(\text{mod} N_s) \qquad (2)$$

Equation (2) can be rewritten as shown in Equation (3).

$$a+c \equiv b+d(\text{mod} N_s) \qquad (3)$$

As a result, when the relationship of Equation (3) is satisfied, a cycle with a length 4 is generated. Generally, when a 0-point and a 4p-point are identical to each other, a relation of $i \equiv i+p(b-c+d-e)(\text{mod } N_s)$ is given, and the following relation shown in Equation (4) is satisfied.

$$p(a-b+c-d) \equiv 0(\text{mod} N_s) \qquad (4)$$

That is, if a positive integer having a minimum value among the positive integers satisfying Equation (4) for a given a, b, c, and d is defined as 'p', a cycle with a length of 4p becomes a cycle having a minimum length in the cycle structure of the block LDPC code illustrated in FIG. 6.

As described above, for (a−b+c−d)≠0, if gcd($N_s$, a−b+c−d)=1 is satisfied, then p=$N_s$. Therefore, a cycle with a length of 4$N_s$ becomes a cycle with a minimum length.

A Richardson-Urbanke technique will be used as a coding technique for the block LDPC code. Because the Richardson-Urbanke technique is used as a coding technique, coding complexity can be minimized as the form of a parity check matrix becomes similar to the form of a full lower triangular matrix.

FIG. 7 is a diagram illustrating a parity check matrix having a form similar to that of the full lower triangular matrix. However, the parity check matrix illustrated in FIG. 7 is different from the parity check matrix having a form of the full lower triangular matrix in the form of the parity part.

In FIG. 7, a superscript (or exponent) $a_{pq}$ of the permutation matrix P of an information part is either $0 \leq a_{pq} \leq N_s-1$ or $a_{pq} = \infty$, as described above. A permutation matrix P with a superscript $a_{pq}=0$, i.e. a permutation matrix $P^0$, of the information part represents an identity matrix $I_{N_s \times N_s}$, and a permutation matrix P with a superscript $a_{pq}=\infty$, i.e. a permutation matrix $P^\infty$, represents a zero matrix. In addition, 'p' represents the number of rows of partial blocks mapped to the information part in the parity check matrix, and 'q' represents the number of columns of partial blocks mapped to the information part. Also, superscripts $a_p$, x and y of the permutation matrices P mapped to the parity part represent exponents of the permutation matrix P.

However, for convenience, the different superscripts $a_p$, x, and y are used to distinguish the parity part from the information part. That is, in FIG. 7, $P^{a_1}$ to $P^{a_p}$ are also permutation matrices, and the superscripts $a_1$ to $a_p$ are sequentially indexed to partial matrices located in a diagonal part of the parity part. In addition, $P^x$ and $P^y$ are also permutation matrices, and for convenience, they are indexed in a different way to distinguish the parity part from the information part.

If a block size of a block LDPC code having the parity check matrix illustrated in FIG. 7 is assumed to be N, the coding complexity of the block LDPC code linearly increases with respect to the block size N (O(N)).

The biggest problem of the LDPC code having the parity check matrix of FIG. 7 is that if a size of a partial block is defined as $N_s$, $N_s$ check nodes whose degrees are always 1 in a factor graph of the block LDPC code are generated. The check nodes with a degree of 1 cannot affect the performance improvement based on the iterative decoding. Therefore, a standard irregular LDPC code based on the Richardson-Urbanke technique does not include a check node with a degree of 1. Therefore, a parity check matrix of FIG. 7 will be assumed as a basic parity check matrix in order to design a parity check matrix such that it enables efficient coding while not including a check node with a degree of 1.

In the parity check matrix of FIG. 7 having the partial matrices, the selection of a partial matrix is a very important factor for a performance improvement of the block LDPC code, such that finding an appropriate selection criterion for the partial matrix also becomes a very important factor.

In order to facilitate a method of designing a parity check matrix of the block LDPC code and a method for coding the block LDPC code, the parity check matrix illustrated in FIG. 7 is assumed to be formed with six partial matrices as illustrated in FIG. 8.

FIG. 8 is a diagram illustrating the parity check matrix of FIG. 7, which is divided into six partial blocks. Referring to FIG. 8, a parity check matrix of the block LDPC code illustrated in FIG. 7 is divided into an information part 's', a first parity part $p_1$, and a second parity part $p_2$. The information part 's' represents a part of the parity check matrix, mapped to an actual information word during the process of coding a block LDPC code, like the information part described in conjunction with FIG. 7, and for convenience, the information part 's' is represented by different reference letters. The first parity part $p_1$ and the second parity part $p_2$ represent a part of the parity check matrix, mapped to an actual parity during the process of coding the block LDPC code, like the parity part described in conjunction with FIG. 7, and the parity part is divided into two parts.

Partial matrices A and C correspond to partial blocks A (802) and C (804) of the information part 's', partial matrices B and D correspond to partial blocks B (806) and D (808) of the first parity part $p_1$, and partial matrices T and E correspond to partial blocks T (810) and E (812) of the second parity part $p_2$. Although the parity check matrix is divided into seven partial blocks in FIG. 8, it should be noted that because '0' is not a separate partial block and the partial matrix T corresponding to the partial block T (810) have a full lower triangular form, a region where zero matrices are arranged on the basis of a diagonal is represented by '0'. A process of simplifying a coding method using the partial matrices of the information part 's', the first parity part $p_1$, and the second parity part $p_2$ will be described later with reference to FIG. 10.

FIG. 9 is a diagram illustrating a transpose matrix of the partial matrix B illustrated in FIG. 8, the partial matrix E, the partial matrix T, and an inverse matrix of the partial matrix T, in the parity check matrix of FIG. 7. Referring to FIG. 9, a partial matrix $B^T$ represents a transpose matrix of the partial matrix B, and a partial matrix $T^{-1}$ represents an inverse matrix of the partial matrix T. The $p^{(k_1 \sim k_2)}$ represents $$\prod_{i=k_i}^{k_2} P^{a_i} = P^{\sum_{i=k_i}^{k_2} a_i}.$$

The permutation matrices illustrated in FIG. 9, for example, $P^{a_1}$, may be identity matrices. As described above, if an exponent of the permutation matrix, i.e., $a_1$, is 0, the permutation matrix $P^{a_1}$ will be an identity matrix. Also, if an exponent of the permutation matrix, i.e., $a_1$, increases by a predetermined value, the permutation matrix is cyclic shifted by the predetermined value, so the permutation matrix $P^{a_1}$ will be an identity matrix.

FIG. 10 is a flowchart illustrating a procedure for generating a parity check matrix of a conventional block LDPC code. However, before a description of FIG. 10 is given, it should be noted that in order to generate a block LDPC code, a codeword size and a coding rate of a block LDPC code to be generated must be determined, and a size of a parity check matrix must be determined according to the determined codeword size and coding rate. If a codeword size of the block LDPC code is represented by N and a coding rate is represented by R, a size of a parity check matrix becomes N(1−R)×N. Actually, the procedure for generating a parity check matrix of a block LDPC code illustrated in FIG. 10 is performed only once, because the parity check matrix is initially generated to be suitable for a situation of a communication system and thereafter, the generated parity check matrix is used.

Referring to FIG. 10, in step 1011, a controller divides a parity check matrix with the size N(1−R)×N into a total of p×q blocks, including p blocks in a horizontal axis and q blocks in a vertical axis. Because each of the blocks has a size of $N_s \times N_s$, the parity check matrix includes $N_s \times p$ rows and $N_s \times q$ columns. In step 1013, the controller classifies the p×q blocks divided from the parity check matrix into an information part 's', a first parity part $p_1$, and a second parity part $p_2$.

In step 1015, the controller separates the information part 's' into non-zero blocks or non-zero matrices, and zero blocks or zero matrices, according to degree distribution for guaranteeing good performance of the block LDPC code. Because the degree distribution for guaranteeing good performance of the block LDPC code has been described above, a detailed description thereof will omitted herein.

In step 1017, the controller determines the permutation matrices $P^{a_{pq}}$ such that a minimum cycle length of a block cycle should be maximized in the non-zero matrix portions in blocks having a low degree from among the blocks determined according to the degree distribution for guaranteeing a good performance of the block LDPC code. The permutation matrices $P^{a_{pq}}$ should be determined taking into consideration the block cycles of the information part 's', the first parity part $p_1$, and the second parity part $p_2$.

In step 1019, the controller randomly determines the permutation matrices $P^{a_{pq}}$ in the non-zero matrix portions in the blocks having a high degree among the blocks determined according to the degree distribution for guaranteeing a good performance of the block LDPC code, and then ends the procedure. Even when the permutation matrices $P^{a_{pq}}$ to be applied to the non-zero matrix portions in the blocks having a high degree are determined, the permutation matrices $P^{a_{pq}}$ must be determined such that a minimum cycle length of a block cycle is maximized, and the permutation matrices $P^{a_{pq}}$ are determined considering the block cycles of not only the information part 's' but also the first parity part $p_1$ and the second parity part $p_2$. An example of the permutation matrices $P^{a_{pq}}$ arranged in the information part 's' of the parity check matrix is illustrated in FIG. 9.

In step 1021, the controller divides the first part $p_1$ and the second parity part $p_2$ into four partial matrices B, T, D, and E. In step 1023, the controller inputs the non-zero permutation matrices $P^y$ and $P^{a_1}$ to four partial blocks among the partial blocks included in the partial matrix B. The structure for inputting the non-zero permutation matrices $P^y$ and $P^{a_1}$ to two partial blocks among the partial blocks included in the partial matrix B has been described with reference to FIG. 9.

In step 1025, the controller inputs the identity matrix I to the diagonal partial blocks of the partial matrix T, and inputs the particular permutation matrices $P^{a_2}, P^{a_3}, \ldots, P^{a_{m-1}}$ to (i, i+1)$^{th}$ partial blocks under the diagonal components of the partial matrix T. The structure for inputting the identity matrix I to the diagonal partial blocks of the partial matrix T and inputting the particular permutation matrices $P^{a_2}, P^{a_3}, \ldots, P^{a_{m-1}}$ to (i, i+1)$^{th}$ partial blocks under the diagonal components of the partial matrix T has been described with reference to FIG. 9.

In step 1027, the controller inputs a permutation matrix $P^x$ to the partial matrix D. In step 1029, the controller inputs a permutation matrix $P^{a_m}$ to only the last partial block in the partial matrix E, and then ends the procedure. As described above, the structure for inputting the two permutation matrices $P^{a_m}$ to only the last partial block among the partial blocks included in the partial matrix E has been described with reference to FIG. 9.

Accordingly, it is known that the LDPC code, together with the turbo code, has a high performance gain during high-speed data transmission and effectively corrects an error caused by noises generated in a transmission channel, contributing to an increase in reliability of data transmission. However, the LDPC code is disadvantageous in the coding rate. That is, because the LDPC code has a relatively high coding rate, it has a limitation in terms of the coding rate.

More specifically, among the currently available LDPC codes, major LDPC codes have a coding rate of 1/2 and only minor LDPC codes have a coding rate of 1/3. The limitation in the coding rate exerts a fatal influence on high-speed, high-capacity data transmission. Although a degree distribution representing the best performance can be calculated using a density evolution scheme in order to implement a relatively low coding rate for the LDPC code, it is difficult to implement an LDPC code having a degree distribution exhibiting the best performance due to various restrictions, such as a cycle structure in a factor graph and hardware implementation.

SUMMARY OF THE INVENTION

It is, therefore, an object of the present invention to provide an apparatus and method for coding and decoding a semi-systematic block Low Density Parity Check (LDPC) code in a mobile communication system.

It is another object of the present invention to provide an apparatus and method for coding and decoding a semi-systematic block LDPC code, the coding complexity of which is minimized, in a mobile communication system.

It is further another object of the present invention to provide an apparatus and method for coding and decoding a semi-systematic block LDPC code with no short cycle in a mobile communication system.

According to one aspect of the present invention, there is provided an apparatus for coding a semi-systematic block low-density parity check (LDPC) code. The apparatus includes: a semi-systematic block LDPC encoder for coding an information word into a codeword including the information word, a first parity, a second parity, and a third parity based on one of a first parity check matrix and a second parity check matrix depending on a size to be applied when generating the information word into a semi-systematic block LDPC code, puncturing a part having a degree being higher than or equal to a predetermined degree from the information word, and generating the semi-systematic block LDPC code including the information word, a part of which being punctured, the first parity, the second parity, and the third parity; a modulator for modulating the semi-systematic block LDPC code into a modulation symbol using a predetermined modulation scheme; and a transmitter for transmitting the modulation symbol.

According to another aspect of the present invention, there is provided an apparatus for decoding a semi-systematic block low-density parity check (LDPC) code. The apparatus includes: a receiver for receiving a signal, and inserting '0' into the received signal according to a control signal; and a decoder for detecting the semi-systematic block LDPC code by determining one of a first parity check matrix and a second parity check matrix according to a size of a semi-systematic block LDPC code to be decoded, and decoding the received 0-inserted signal according to the determined parity check matrix.

According to further another aspect of the present invention, there is provided a method for coding a semi-systematic block low-density parity check (LDPC) code. The method includes the steps of: receiving an information word; coding the information word into a codeword including the information word, a first parity, a second parity, and a third parity based on one of a first parity check matrix and a second parity check matrix, depending on a size to be applied when generating the information word into a semi-systematic block LDPC code; puncturing a part having a degree being higher than or equal to a predetermined degree from the information word; and generating the semi-systematic block LDPC code including the information word, a part of which being punctured, the first parity, the second parity, and the third parity.

According to yet another aspect of the present invention, there is provided a method for decoding a semi-systematic block low-density parity check (LDPC) code. The method includes the steps of: receiving a signal; inserting '0' into the received signal according to a control signal; determining one of a first parity check matrix and a second parity check matrix according to a size of a semi-systematic block LDPC code to be decoded; and detecting the semi-systematic block LDPC code by decoding the received 0-inserted signal according to the determined parity check matrix.

BRIEF DESCRIPTION OF THE DRAWINGS

The above and other objects, features, and advantages of the present invention will become more apparent from the following detailed description when taken in conjunction with the accompanying drawings in which:

FIG. 4 is a diagram illustrating a parity check matrix of a conventional block LDPC code;

FIG. 5 is a diagram illustrating the permutation matrix P as illustrated in FIG. 4;

FIG. 7 is a diagram illustrating a parity check matrix having a form similar to that of a full lower triangular matrix;

FIG. 9 is a diagram illustrating a transpose matrix of a partial matrix B illustrated in FIG. 8, a partial matrix E, a partial matrix T, and an inverse matrix of the partial matrix T;

DETAILED DESCRIPTION OF THE PREFERRED EMBODIMENT

Preferred embodiments of the present invention will now be described in detail herein below with reference to the annexed drawings. In the following description, a detailed description of known functions and configurations incorporated herein has been omitted for conciseness.

The present invention proposes an apparatus and method for coding and decoding a semi-systematic block Low Density Parity Check (LDPC) code. In particular, the present invention proposes an apparatus and method for coding and decoding a semi-systematic block LDPC code in which single parity check codes are concatenated. That is, the present invention proposes an apparatus and method for coding and decoding a semi-systematic block LDPC code in which a length of a minimum cycle in a factor graph of a block LDPC code is maximized, coding complexity of the block LDPC code is minimized, and real-time coding is possible.

Figures 1, 2:
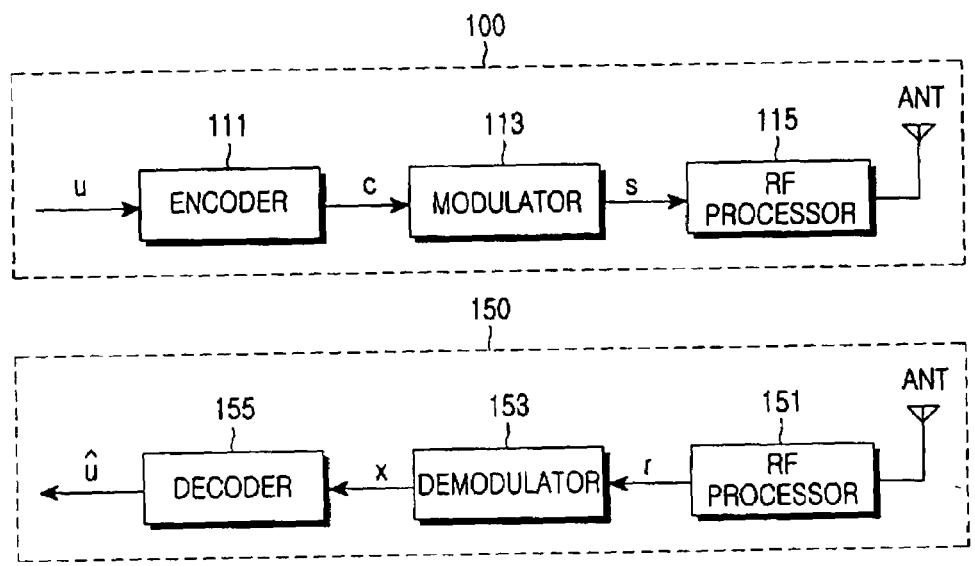
FIG. 1 is a diagram illustrating a transceiver in a conventional mobile communication system.
FIG. 2 is a diagram illustrating a parity check matrix of a conventional (8, 2, 4) LDPC code.
Figure 3:
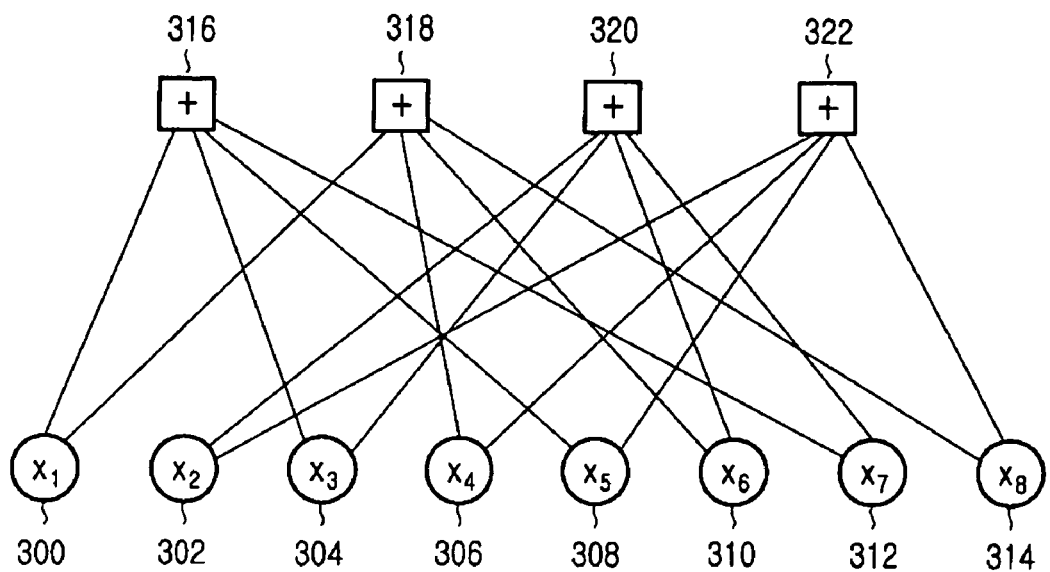
FIG. 3 is a diagram illustrating a factor graph of the (8, 2, 4) LDPC code illustrated in FIG. 2.
Figure 6:
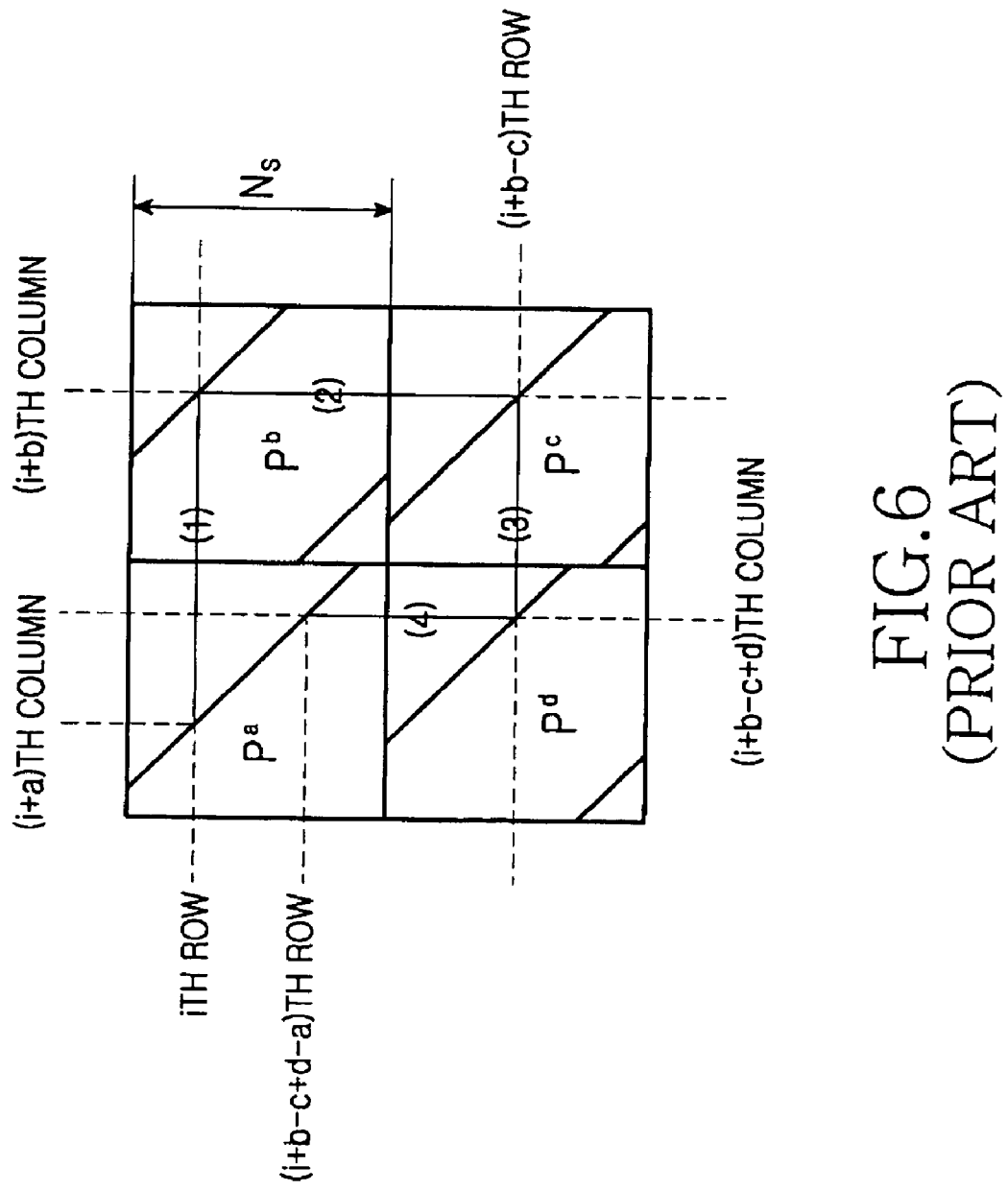
FIG. 6 is a diagram illustrating a cycle structure of a block LDPC code of which a parity check matrix includes four partial matrices.

Although not separately illustrated in the specification, the novel coding and decoding apparatus for a semi-systematic block LDPC code according to the present invention can be applied to the transceiver described with reference to FIG. 1.

Generally, in a linear block code, a systematic code refers to a code in which a part of a codeword during its transmission is comprised of information bits (or information word) to be transmitted. Therefore, a receiver can decode only the part corresponding to the information word in the codeword when decoding the codeword transmitted from a transmitter.

However, a non-systematic code refers to a code for which an encoder transmits a codeword mapped to an information word, instead of transmitting the information word during transmission of the codeword. That is, unlike the systematic code in which a part of the codeword includes the information word, the non-systematic code has no information word included in the codeword. The semi-systematic block LDPC code proposed in the present invention refers to a code in which only a part of the information word is included in the codeword and the remaining parity is included in the codeword, unlike the systematic code in which the entire information word is included in the codeword.

Generally, in a block LDPC code, a part corresponding to variable nodes having a high degree is very high in reliability compared with a part corresponding to variable nodes having a low degree. The "degree" refers to the number of edges connected to the variable nodes corresponding to codeword bits in a factor graph. Generally, the high degree refers to a degree of 4 or higher, and the low degree refers to a degree of 3 or below. Therefore, the semi-systematic block LDPC code proposed in the present invention does not include an information word part corresponding to variable nodes having a high degree, which is a part having high reliability with the use of a code that has a large size and has a coding rate slightly lower than a desired coding rate. However, when the information word part corresponding to the variable nodes having the high degree is not transmitted, an error probability of the part increases. Therefore, the semi-systematic block LDPC code proposed in the present invention reduces the error probability by concatenating a single parity check code to the information part corresponding to the variable nodes having the high degree.

The "single parity check code" refers to a code in which a weight of a codeword is an even number. If a weight of an information word calculated during coding of the single parity check code is an odd number, parity is added to an end of a codeword, which has a non-zero value, for example, a value of 1. If the weight is an even number, parity is added to an end of a codeword, which has a value of 0.

In addition, the semi-systematic block LDPC code proposed in the present invention, as it has a semi-systematic structure, does not transmit a part of an information word. Therefore, the non-transmitted information word undergoes an erasure process in a decoder of a receiver. The erasure-processed information word is decoded on the assumption that a log likelihood ratio (LLR) value of the corresponding bits is 0.

Assuming that the total number of columns in a parity check matrix is N, the number of bits for an information word part is K, and the number of bits for the information word part, which is to be punctured, is $K_p$, the number of bits for a packet, which are actually transmitted, becomes $N-K_p$. Therefore, a coding rate R can be expressed as shown in Equation (5).

$$R = \frac{K}{N - K_p} \tag{5}$$

Figure 11:
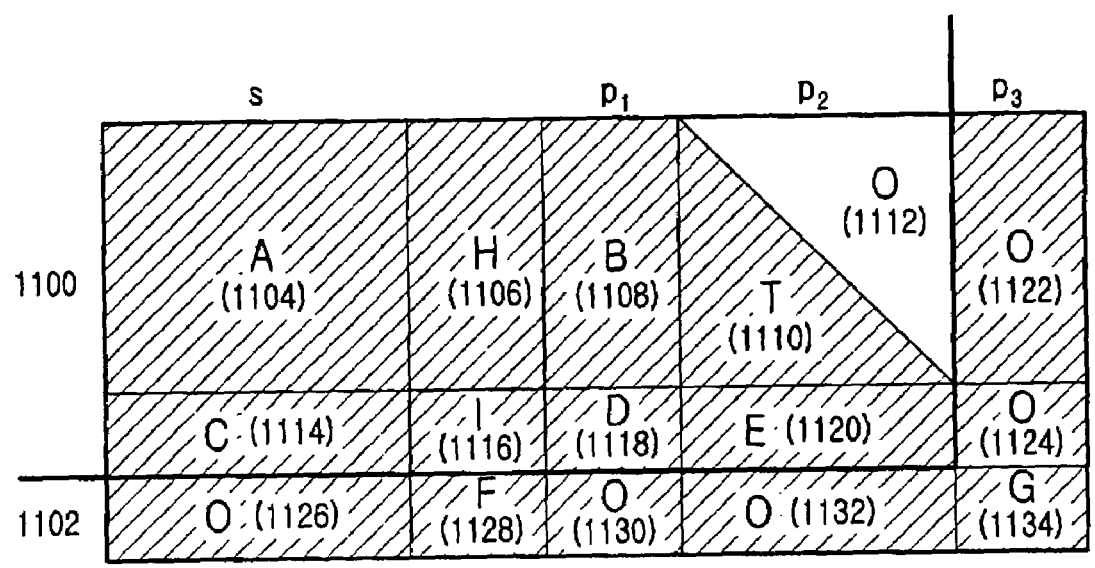
FIG. 11 is a diagram illustrating a parity check matrix of a semi-systematic block LDPC code according to an embodiment of the present invention.

FIG. 11 is a diagram illustrating a parity check matrix of a semi-systematic block LDPC code according to an embodiment of the present invention. Referring to FIG. 11, the parity check matrix of the semi-systematic block LDPC code proposed in the present invention includes a part 1100 corresponding to a parity check matrix of a general block LDPC code and a part 1102 corresponding to newly-added partial blocks. In FIG. 11, the part 1100 corresponding to the parity check matrix of the general block LDPC code and the part 1102 corresponding to the newly-added partial blocks are divided by a bold line. For convenience, the part 1100 corresponding to the parity check matrix of the general block LDPC code will be referred to as an "existing part" and the part 1102 corresponding to the newly-added partial blocks will be referred to as a "new part."

The existing part 1100 is formed by dividing a parity check matrix of a general block LDPC code into an information part 's', a first parity part $p_1$, and a second parity part $p_2$. The information part 's' represents a part of the parity check matrix, which is mapped to an actual information word during the process of coding a block LDPC code. The first parity part $p_1$ and the second parity part $p_2$ represent a part of the parity check matrix that is mapped to an actual parity during the process of coding the block LDPC code.

Partial matrices A, H, C, and I correspond to partial blocks A (1104), H (1106), C (1114), and I (1116) of the information part 's', partial matrices B and D correspond to partial blocks B (1108) and D (1118) of the first parity part $p_1$, and partial matrices 0, T, and E correspond to partial blocks 0 (1112), T (1110), and E (1120) of the second parity part $p_2$.

In the new part 1102, as illustrated in FIG. 11, partial matrices 0 and F correspond to partial blocks 0 (1126) and F (1128) of the information part 's', a partial matrix 0 corresponds to a partial block 0 (1130) of the first parity part $p_1$, a partial matrix 0 corresponds to a partial block 0 (1132) of the second parity part $p_2$, and partial matrices, 0, 0, and G correspond to partial blocks 0 (1122), 0 (1124), and G (1134) of a third parity part $p_3$.

As described above, all of the partial blocks except for the partial blocks F (1128) and G (1134) of the new part 1102 correspond to 0 (zero)-matrices. The "0-matrix" refers to a matrix in which all of the elements included in the matrix are 0.

Figure 8:
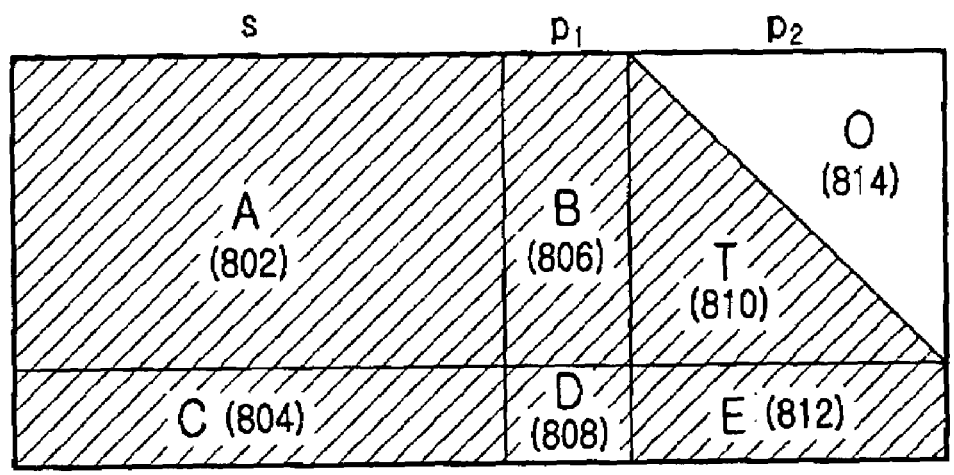
FIG. 8 is a diagram illustrating the parity check matrix illustrated in FIG. 7, which is divided into six partial blocks.
Figure 10:
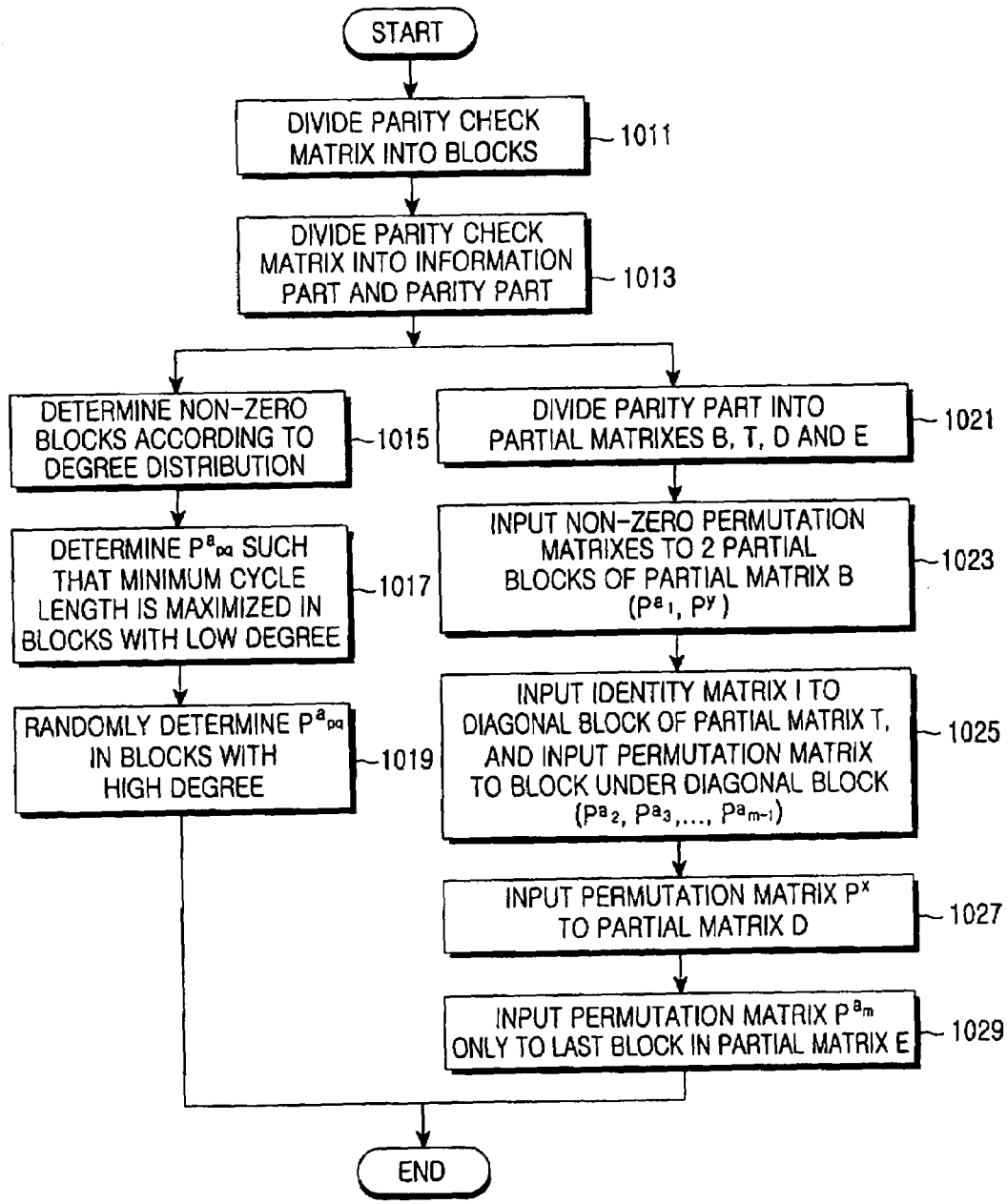
FIG. 10 is a flowchart illustrating a procedure for generating a parity check matrix of a conventional block LDPC code.

The existing part 1100 is different in structure from the parity check matrix of the general block LDPC code described in the prior art section. That is, the partial blocks H (1106) and I (1116) represent partial blocks separated from the information part 's', which correspond to variable nodes having a high degree in the partial blocks A (802) and C (804) of the information part 's' of the parity check matrix of the general block LDPC code described in connection with FIG. 8.

The partial block F (1128), together with the partial blocks H (1106) and I (1116), corresponds to the variable nodes having a high degree in the information part 's', and the partial block G (1134) corresponds to the third parity part $p_3$ of the semi-systematic block LDPC code. Further, the partial block G (1134) corresponds to a full lower triangular matrix, for coding simplicity.

Although the present invention will be described with reference to an example in which a full lower triangular matrix is mapped to the partial block G (1134), a matrix other than the full lower triangular matrix can also be mapped to the partial block G (1134).

The semi-systematic block LDPC code proposed in the present invention is characterized in that an information part having a high degree, corresponding to the partial blocks H (1106), I (1116), and F (1128), of the parity check matrix is not transmitted and the same amount of third parity corresponding to the partial block G (1134) as that of the information part having the high degree is additionally transmitted.

The information part having a high degree is not transmitted because it generally has high reliability. However, if the information part having a high degree is not transmitted, an error probability increases at the information part having a high degree, such that the third parity is transmitted to maintain the reliability.

Additionally, although FIG. 11 illustrates a 2-part structure, by way of example, for a comparison between the semi-systematic block LDPC code proposed in the present invention and the general block LDPC code in terms of the characteristics of the parity check matrices, the semi-systematic block LDPC code can also have a different structure regardless of the structure of the parity check matrix of the general block LDPC code.

Figure 12:
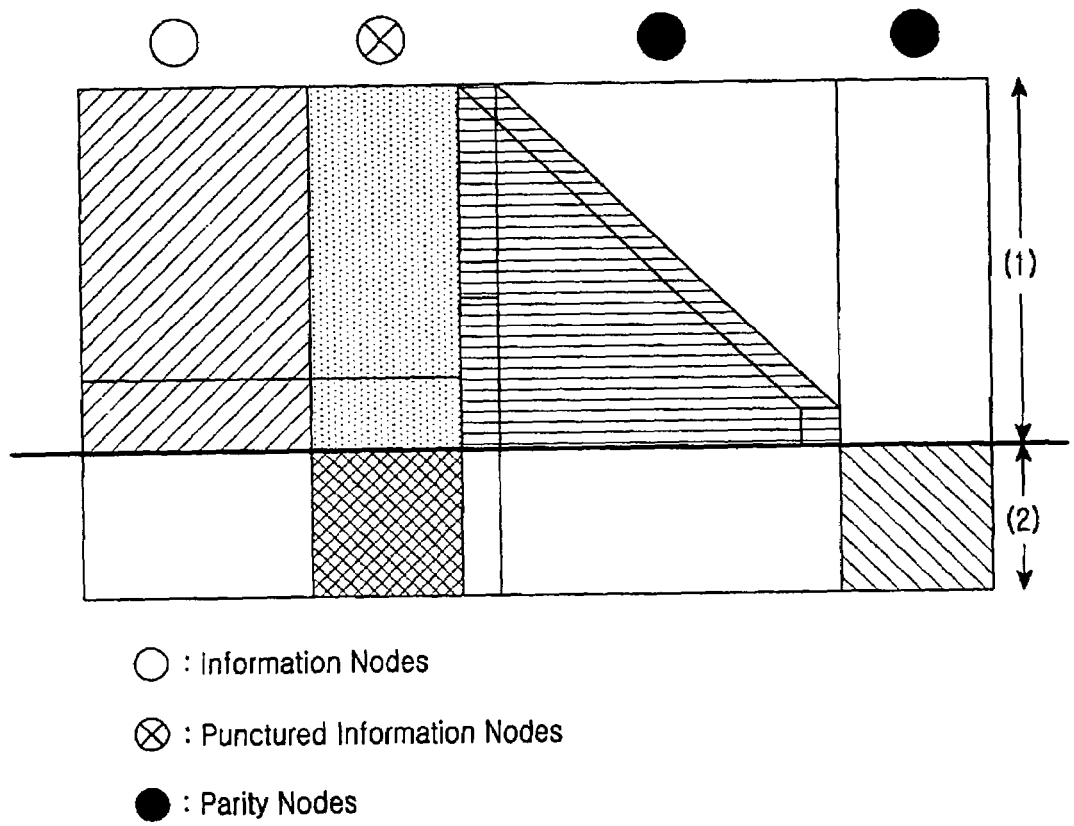
FIG. 12 is a diagram illustrating an example of the parity check matrix of the semi-systematic block LDPC code illustrated in FIG. 11.

FIG. 12 is a diagram illustrating an example of the parity check matrix of the semi-systematic block LDPC code illustrated in FIG. 11. The parity check matrix of the semi-systematic block LDPC code illustrated in FIG. 12 represents a matrix in which the partial matrix G mapped to the partial block G (1134) in the parity check matrix of the block LDPC code described in conjunction with FIG. 11 is replaced with an identity matrix I. The "identity matrix" refers to a matrix in which only diagonal elements have a value of 1 and all of the other elements except for the diagonal elements have a value of 0.

When coding is performed using the parity check matrix of the semi-systematic block LDPC code illustrated in FIG. 12, a structure of an encoder for coding the semi-systematic block LDPC code is roughly divided into two parts. That is, as illustrated in FIG. 12, a part (1) has the same encoder structure as that of the parity check matrix of the general block LDPC code, and a part (2) has a form in which single parity check codes are concatenated, wherein parity bits are generated independently of other parity bits. That is, the encoder structure corresponding to the parity check matrix of the semi-systematic block LDPC code has the form in which encoder structure corresponding to the conventional block LDPC code and the encoder structure corresponding to the single parity check code are concatenated.

The parity part of the general block LDPC code can perform parity generation only block by block because it has an accumulator structure. However, the single parity check code part can perform coding on the part (2) at a time because it has a structure in which only the diagonal elements having a value of 1. Therefore, the semi-systematic block LDPC code proposed in the present invention is almost similar to the general block LDPC code in terms of a coding time.

Figure 13:
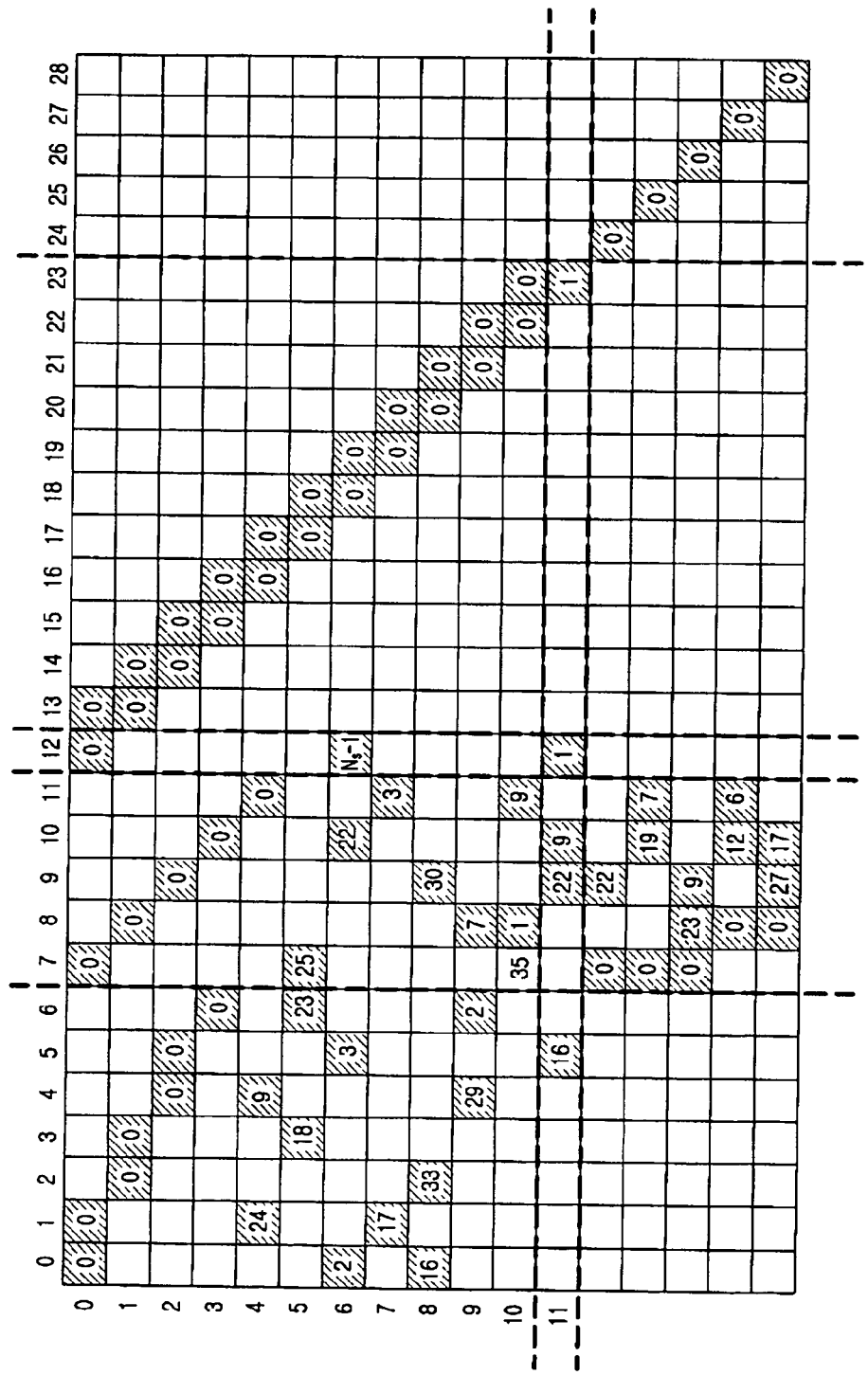
FIG. 13 is a diagram illustrating a parity check matrix of a semi-systematic block LDPC code according to an embodiment of the present invention, in which a coding rate is 1/2, a block size is $24N_s$ and an information word size is $12N_s$.

FIG. 13 is a diagram illustrating a parity check matrix of a semi-systematic block LDPC code according to an embodiment of the present invention, in which a coding rate is 1/2, a block size is $24N_s$ and an information word size is $12N_s$. Referring to FIG. 13, $N_s$ represents a size of a partial block, and the size of the partial block is assumed to be 4, 8, 12, 16, 20, 24, 32, 36, and 40. In this case, it is possible to generate a semi-systematic block LDPC code having a block size of 96, 192, 288, 384, 480, 576, 672, 768, 864, and 960 using one parity check matrix of the semi-systematic block LDPC code.

As illustrated in FIG. 13, values written in the partial blocks constituting the parity check matrix of the semi-systematic block LDPC code represent exponent values of permutation matrices mapped to the partial blocks. An exponent value of a permutation matrix for the parity check matrix of the block LDPC code with a block size $N_s$ can be calculated by performing a modulo-$N_s$ operation on the exponent of the permutation matrix. If a value obtained by performing a modulo-$N_s$ operation on an exponent of the permutation matrix is 0, the corresponding permutation matrix becomes an identity matrix.

A parity check matrix of a semi-systematic block LDPC code illustrated in FIG. 13 is referred to as a "mother matrix," the number of non-zero permutation matrices among the partial matrices, i.e., the permutation matrices, constituting the mother matrix is defined as L, the exponents of the L non-zero permutation matrices among the permutation matrices constituting the mother matrix are represented by $a_1, a_2, \ldots, a_L$, and a size of the permutation matrices constituting the mother matrix is assumed to be $N_s$. Because the number of non-zero permutation matrices among the permutation matrices included in the mother matrix is L, an exponent of a first permutation matrix becomes $a_1$, an exponent of a second permutation matrix becomes $a_2$, and in this manner, an exponent of the last permutation matrix becomes $a_L$.

Unlike the mother matrix, a parity check matrix to be newly generated is referred to as a "child matrix," the number of non-zero permutation matrices among the partial matrices, i.e., the permutation matrices, included in the child matrix is defined as L, a size of the permutation matrices constituting the child matrix is defined as $N_s'$, and the exponents of the permutation matrices constituting the child matrix are represented by $a_1', a_2', \ldots, a_L'$. Because the number of non-zero permutation matrices among the permutation matrices included in the child matrix is L, an exponent of a first permutation matrix becomes $a_1'$, an exponent of a second permutation matrix becomes $a_2'$, and in this manner, an exponent of the last permutation matrix becomes $a_L'$.

Using Equation (6) below, it is possible to generate a child matrix having a variable block size by selecting a size $N_s'$ of the permutation matrices constituting a child matrix to be generated from one mother matrix.

$$a_i' = a_i \bmod N_s' \text{ (for } 1 \leq i \leq L) \quad (6)$$

The partial block segmentations in FIG. 13 are equal to the partial block segmentations in FIG. 11. As illustrated in FIG. 13, permutation matrices, i.e., identity matrices, are arranged in partial blocks corresponding to the partial block T (1110) of FIG. 11 in the full lower triangular form. In addition, the permutation matrices are arranged in lower blocks, which are in parallel with the blocks in which permutation matrices are arranged in the full lower triangular form.

In addition, permutation matrices are arranged in predetermined blocks among the partial blocks mapped to the first parity part $p_1$, i.e., the partial blocks B (1108), D (1118), and 0 (1130). Further, the permutation matrices are arranged in the partial blocks mapped to the information part 's', i.e., the partial blocks A (1104), H (1106), C (1114), I (1116), 0 (1126), and F (1128), such that a minimum cycle length in a factor graph of the semi-systematic block LDPC code is maximized and a weight is regular.

Figure 14:
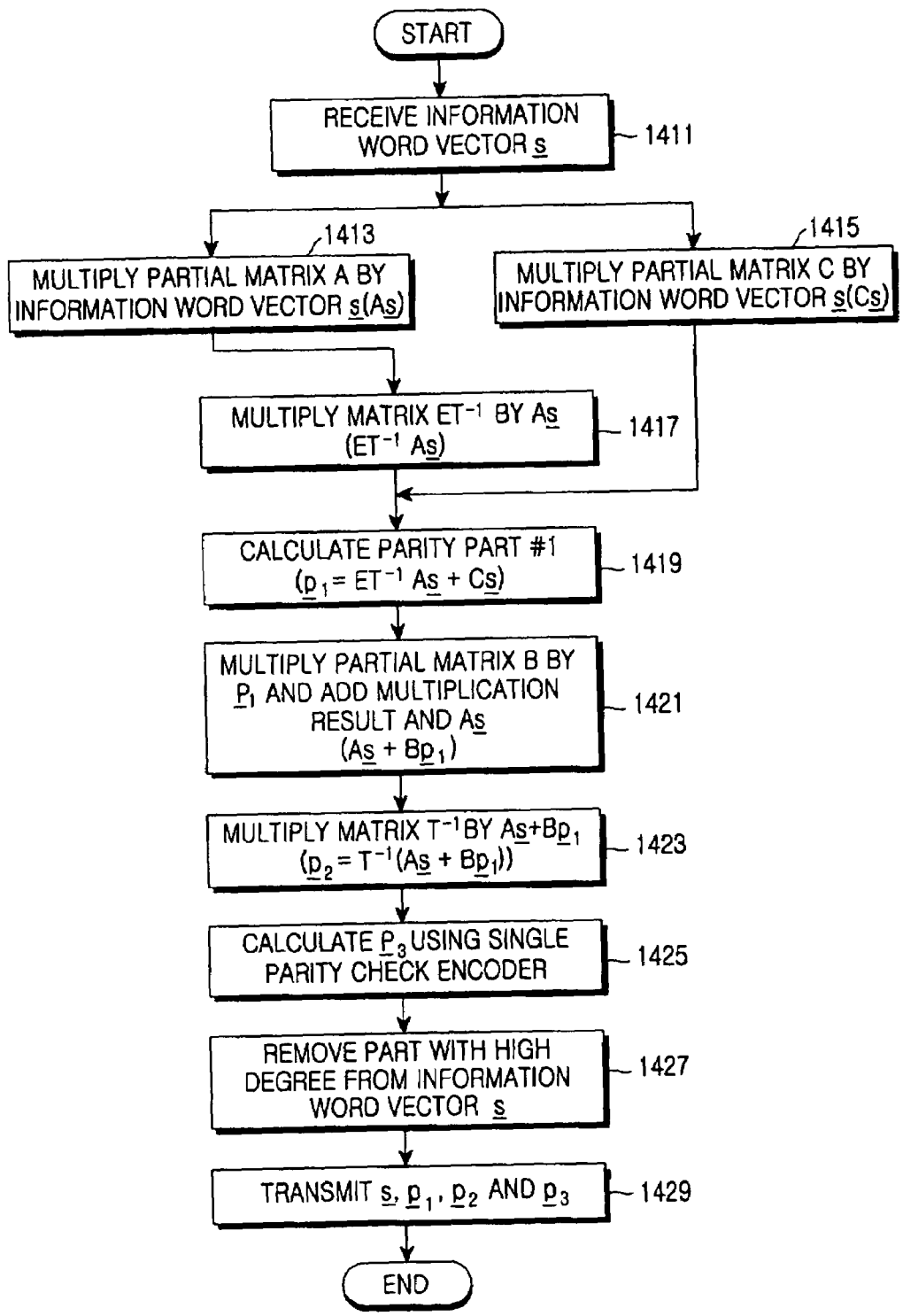
FIG. 14 is a flowchart illustrating a process of coding a semi-systematic block LDPC code according to an embodiment of the present invention.

FIG. 14 is a flowchart illustrating a process of coding a semi-systematic block LDPC code according to an embodiment of the present invention. However, before a description of FIG. 14 is given, it will be assumed that a parity check matrix of the semi-systematic block LDPC code is equal to the parity check matrix described with reference to FIG. 11.

Referring to FIG. 14, in step 1411, a controller (not shown) receives an information word vector 's' to be coded into the semi-systematic block LDPC code. It is assumed herein that a size of the information word vector 's' received to be coded into the semi-systematic block LDPC code is k.

In step 1413, the controller matrix-multiplies the received information word vector 's' by a partial matrix A of the parity check matrix ($A\underline{s}$). Herein, because the number of elements having a value of 1 located in the partial matrix A is much less than the number of elements having a value of 0, the matrix multiplication ($A\underline{s}$) of the information word vector $\underline{s}$ and the partial matrix A of the parity check matrix can be achieved with a relatively small number of sum-product operations. In addition, in the partial matrix A, because the position where elements having a value of 1 are located can be expressed as exponential multiplication of a position of a non-zero block and a permutation matrix of the block, the matrix multiplication can be performed with a very simple operation as compared with a random parity check matrix.

In step 1415, the controller performs matrix multiplication ($C\underline{s}$) on a partial matrix C of the parity check matrix and the information word vector '$\underline{s}$'.

In step 1417, the controller performs matrix multiplication ($ET^{-1}A\underline{s}$) on the matrix multiplication result ($A\underline{s}$) of the information word vector '$\underline{s}$' and the partial matrix A of the parity check matrix, and a matrix $ET^{-1}$. Because the number of elements having a value of 1 in the matrix $ET^{-1}$ is very small, if an exponent of a permutation matrix of the block is given, the matrix multiplication can be simply performed. In step 1419, the controller calculates a first parity part vector $\underline{P}_1$ by adding the $ET^{-1}A\underline{s}$ and the $C\underline{s}$ ($\underline{P}_1 = ET^{-1}A\underline{s} + C\underline{s}$). Herein, the addition operation is an exclusive OR (XOR) operation, and its result becomes 0 for an operation between bits having the same value and 1 for an operation between bits having different values. That is, the process up to step 1419 is a process for calculating the first parity part vector $\underline{P}_1$.

In step 1421, the controller multiplies a partial matrix B of the parity check matrix by the first parity part vector $\underline{P}_1$ ($B\underline{P}_1$), and adds the multiplication result ($B\underline{P}_1$) to the $A\underline{s}$ ($A\underline{s} + B\underline{P}_1$). If the information word vector '$\underline{s}$' and the first parity part vector $\underline{P}_1$ are given, they should be multiplied by an inverse matrix $T^{-1}$ of a partial matrix T of the parity check matrix to calculate a second parity part vector $\underline{P}_2$. Therefore, in step 1423, the controller multiplies the calculation result ($A\underline{s} + B\underline{P}_1$) of step 1421 by the inverse matrix $T^{-1}$ of the partial matrix T to calculate the second parity part vector $\underline{P}_2$ ($\underline{P}_2 = T^{-1}(A\underline{s} + B\underline{P}_1)$).

As described above, if the information word vector '$\underline{s}$' of a block LDPC code to be coded is given, the first parity part vector $\underline{P}_1$ and the second parity part vector $\underline{P}_2$ can be calculated, and as a result, all codeword vectors can be obtained.

In step 1425, the controller calculates a third parity part vector $\underline{P}_3$ using a single parity check matrix. Herein, the third parity part vector $\underline{P}_3$ is transmitted instead of an information word corresponding to variable nodes having a high degree, i.e., a non-transmission information word, in the information word vector '$\underline{s}$'.

In step 1427, the controller removes the information word corresponding to the variable nodes having a high degree in the information word vector '$\underline{s}$'. In step 1429, the controller generates a codeword vector '$\underline{c}$' using the information word vector '$\underline{s}$' from which the information word corresponding to the variable nodes having a high degree is removed, the first parity part vector $\underline{P}_1$, the second parity part vector $\underline{P}_2$, and the third parity part vector $\underline{P}_3$, and transmits the generated codeword vector '$\underline{c}$'.

As will be described in detail with reference to FIG. 15, because the embodiment of the present invention should be able to generate a semi-systematic block LDPC code having a variable block size $N_s$, each of matrices used in a coding apparatus for the semi-systematic block LDPC code, illustrated in FIG. 15, should be changed correspondingly each time a parity check matrix of the semi-systematic block LDPC code is changed. Therefore, though not separately illustrated in FIG. 15, the controller changes the matrices used in the coding process of the semi-systematic block LDPC code according to a change in the parity check matrix of the semi-systematic block LDPC code.

Figure 15:
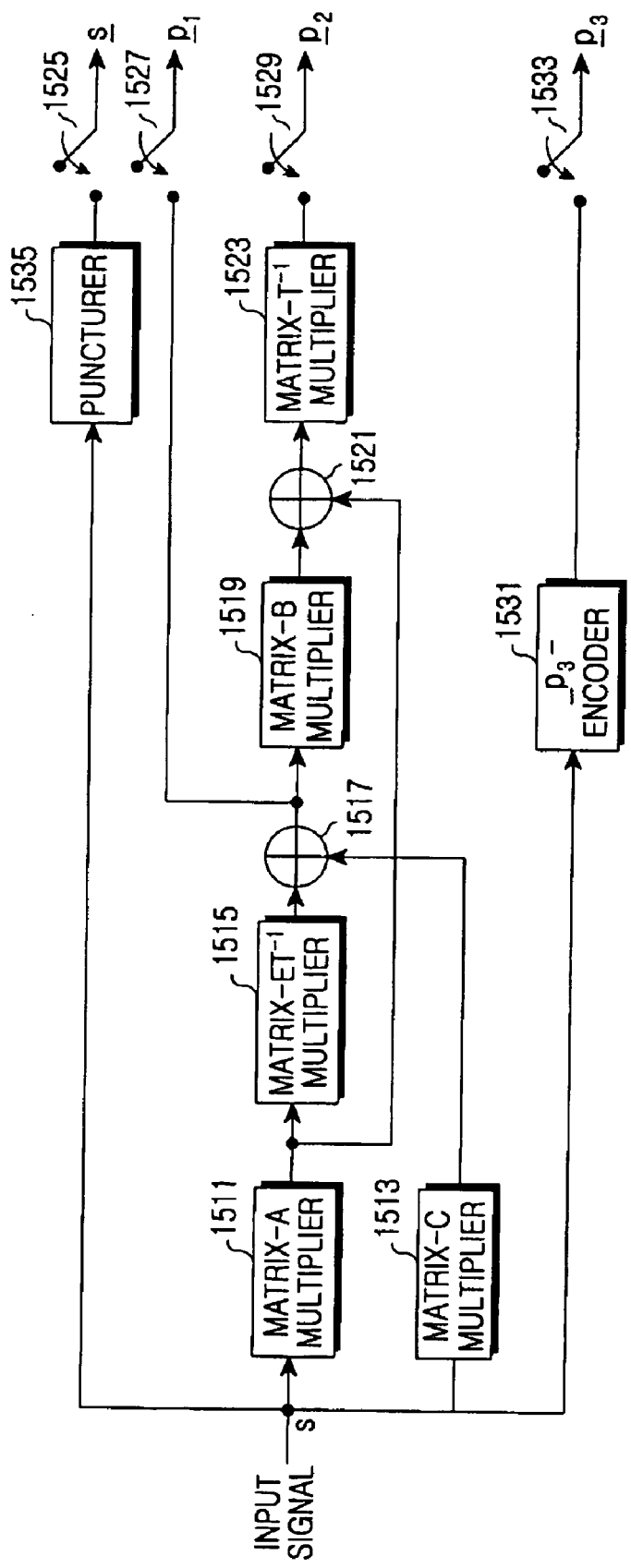
FIG. 15 is a block diagram illustrating an internal structure of an apparatus for coding a semi-systematic block LDPC code according to an embodiment of the present invention.

FIG. 15 is a block diagram illustrating an internal structure of an apparatus for coding a semi-systematic block LDPC code according to an embodiment of the present invention. Referring to FIG. 15, the apparatus for coding a semi-systematic block LDPC code includes a matrix-A multiplier 1511, matrix-C multiplier 1513, a matrix-ET$^{-1}$ multiplier 1515, an exclusive adder 1517, a matrix-B multiplier 1519, an exclusive adder 1521, a matrix-T$^{-1}$ multiplier 1523, a $\underline{P}_3$-encoder 1531, switches 1525, 1527, 1529, and 1533, and a puncturer 1535.

If an input signal, i.e., a size-k information word vector '$\underline{s}$' to be coded into a semi-systematic block LDPC code, is received, the received size-k information word vector '$\underline{s}$' is input to the puncturer 1535, the matrix-A multiplier 1511, the matrix-C multiplier 1513, and the $\underline{P}_3$-encoder 1531.

The matrix-A multiplier 1511 multiplies the information word vector '$\underline{s}$' by a partial matrix A of the full parity check matrix, and outputs the multiplication result to the matrix-ET$^{-1}$ multiplier 1515 and the exclusive adder 1521. The matrix-C multiplier 1513 multiplies the information word vector '$\underline{s}$' by a partial matrix C of the full parity check matrix, and outputs the multiplication result to the exclusive adder 1517.

The puncturer 1535 punctures an information word corresponding to the variable nodes having a high degree from the information word vector '$\underline{s}$', and outputs the puncturing result to the switch 1525. Herein, the puncturer 1535 punctures a corresponding information word from the information word vector '$\underline{s}$' under the control of a controller. The controller controls a puncturing operation of the puncturer 1535 according to a coding rate of the semi-systematic block LDPC code. The $\underline{P}_3$-encoder 1531 receives the information word vector '$\underline{s}$', generates a third parity part vector $\underline{P}_3$ to be transmitted instead of the information word that is punctured from the information word vector '$\underline{s}$' according to the variable nodes having a high degree, and outputs the third parity part vector $\underline{P}_3$ to the switch 1533. The signal output from the $\underline{P}_3$-encoder 1531 becomes the third parity part vector $\underline{P}_3$.

The matrix-ET$^{-1}$ multiplier 1515 multiplies the signal output from the matrix-A multiplier 1511 by a partial matrix ET$^{-1}$ of the full parity check matrix, and outputs the multiplication result to the exclusive adder 1517. The exclusive adder 1517 adds the signal output from the matrix-ET$^{-1}$ multiplier 1515 to the signal output from the matrix-C multiplier 1513, and outputs the addition result to the matrix-B multiplier 1519 and the switch 1527.

Herein, the exclusive adder 1517 performs the XOR operation on a bit-by-bit basis. For example, if a size-3 vector of $x=(x_1, x_2, x_3)$ and a size-3 vector of $y=(y_1, y_2, y_3)$ are input to the exclusive adder 1517, the exclusive adder 1517 outputs a size-3 vector of $z=(x_1 \oplus y_1, x_2 \oplus y_2, x_3 \oplus y_3)$ by XORing the size-3 vector of $x=(x_1, x_2, x_3)$ and the size-3 vector of $y=(y_1, y_2, y_3)$. Herein, the $\oplus$ operation represents the XOR operation, a result of which becomes 0 for an operation between bits having the same value, and 1 for an operation between bits having different values. The signal output from the exclusive adder 1517 becomes a first parity part vector $\underline{P}_1$.

The matrix-B multiplier 1519 multiplies the signal output from the exclusive adder 1517, i.e., the first parity part vector $\underline{P}_1$, by a partial matrix B of the full parity check matrix, and outputs the multiplication result to the exclusive adder 1521. The exclusive adder 1521 adds the signal output from the matrix-B multiplier 1519 to the signal output from the matrix-A multiplier 1511, and outputs the addition result to the matrix-T$^{-1}$ multiplier 1523. The exclusive adder 1521, like the exclusive adder 1517, performs the XOR operation on the signal output from the matrix-B multiplier 1519 and the signal output from the matrix-A multiplier 1511, and outputs the XOR operation result to the matrix-T$^{-1}$ multiplier 1523.

The matrix-T$^{-1}$ multiplier 1523 multiplies the signal output from the exclusive adder 1521 by an inverse matrix T$^{-1}$ of a partial matrix T of the parity check matrix, and outputs the multiplication result to the switch 1529. The output of the matrix-T$^{-1}$ multiplier 1523 becomes a second parity part vector $\underline{P}_2$.

Each of the switches 1525, 1527, 1529, and 1533 is switched on only at its transmission time to transmit its associated signal. The switch 1525 is switched on at a transmission time of the information word vector '$\underline{s}$', the switch 1527 is switched on at a transmission time of the first parity part vector $\underline{P}_1$, the switch 1529 is switched on at a transmission time of the second parity part vector $\underline{P}_2$, and the switch 1533 is switched on at a transmission time of the third parity part vector $\underline{P}_3$.

Because the embodiment of the present invention should be able to generate a semi-systematic block LDPC code having a variable size, each of matrices used in a coding apparatus for the semi-systematic block LDPC code; illustrated in FIG. 15, should be changed correspondingly each time a parity check matrix of the semi-systematic block LDPC code is changed. Therefore, though not separately illustrated in FIG. 15, the controller changes the matrices used in the coding process of the semi-systematic block LDPC code according to a change in the parity check matrix of the semi-systematic block LDPC code.

All of the LDPC-family codes can be decoded in a factor graph using a sub-product algorithm. A decoding scheme of the LDPC code can be roughly divided into a bidirectional transfer scheme and a flow transfer scheme. When a decoding operation is performed using the bidirectional transfer scheme, each check node has a node processor, thereby increasing decoding complexity in proportion to the number of the check nodes. However, because all of the check nodes are simultaneously updated, the decoding speed increases remarkably.

Conversely, the flow transfer scheme has a single node processor, and the node processor updates information, passing through all of the nodes in a factor graph. Therefore, the flow transfer scheme is lower in decoding complexity, but an increase in size of the parity check matrix, i.e., an increase in number of nodes, causes a decrease in the decoding speed. However, if a parity check matrix is generated per block like the semi-systematic block LDPC code having various block sizes according to coding rates, proposed in the present invention, then a number of node processors are equal to the number of blocks constituting the parity check matrix during decoding. In this case, it is possible to implement a decoder, which is lower than the bidirectional transfer scheme in the decoding complexity and higher than the flow transfer scheme in the decoding speed.

Figure 16:
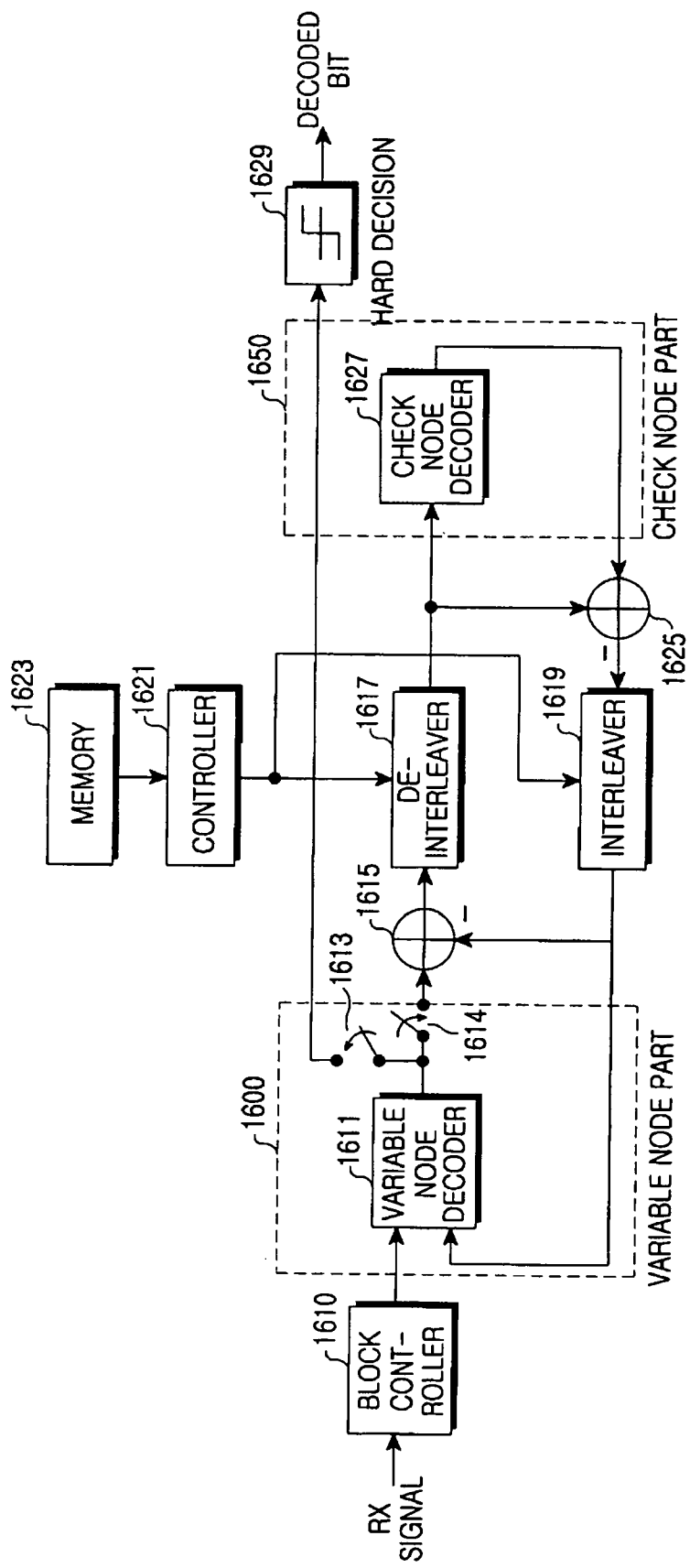
FIG. 16 is a block diagram illustrating an internal structure of an apparatus for a semi-systematic block LDPC code according to an embodiment of the present invention.

FIG. 16 is a block diagram illustrating an internal structure of an apparatus for a semi-systematic block LDPC code according to an embodiment of the present invention. Referring to FIG. 16, the decoding apparatus for a semi-systematic block LDPC code includes a block controller 1610, a variable node part 1600, an adder 1615, a deinterleaver 1617, an interleaver 1619, a controller 1621, a memory 1623, an adder 1625, a check node part 1650, and a hard decider 1629. The variable node part 1600 includes a variable node decoder 1611 and switches 1613 and 1614 and the check node part 1650 includes a check node decoder 1627.

A signal received over a radio channel is input to the block controller 1610. The block controller 1610 determines a block size of the received signal. If there is an information word part punctured in a coding apparatus corresponding to the decoding apparatus, the block controller 1610 inserts '0' into the punctured information word part to adjust the full block size, and outputs the resultant signal to the variable node decoder 1611.

The variable node decoder 1611 calculates probability values of the signal output from the block controller 1610, updates the calculated probability values, and outputs the updated probability values to the switches 1613 and 1614. The variable node decoder 1611 connects the variable nodes according to a parity check matrix previously set in the decoding apparatus for the semi-systematic block LDPC code, and performs an update operation on as many input values and output values as the number of 1s connected to the variable nodes. The number of 1s connected to the variable nodes is equal to a weight of each of the columns included in the parity check matrix. An internal operation of the variable node decoder 1611 differs according to a weight of each of the columns constituting the parity check matrix. When the switch 1613 is not switched on, the switch 1614 is switched on to output the output signal of the variable node decoder 1611 to the adder 1615.

The adder 1615 receives a signal output from the variable node decoder 1611 and an output signal of the interleaver 1619 in a previous iterative decoding process, subtracts the output signal of the interleaver 1619 in the previous iterative decoding process from the output signal of the variable node decoder 1611, and outputs the subtraction result to the deinterleaver 1617. If the decoding process is an initial decoding process, it should be regarded that the output signal of the interleaver 1619 is 0.

The deinterleaver 1617 deinterleaves the signal output from the adder 1615 according to a predetermined interleaving scheme, and outputs the deinterleaved signal to the adder 1625 and the check node decoder 1627. The deinterleaver 1617 has an internal structure corresponding to the parity check matrix because an output value for an input value of the interleaver 1619 corresponding to the deinterleaver 1617 is different according to a position of elements having a value of 1 in the parity check matrix.

The adder 1625 receives an output signal of the check node decoder 1627 in a previous iterative decoding process and an output signal of the deinterleaver 1617, subtracts the output signal of the deinterleaver 1617 from the output signal of the check node decoder 1627 in the previous iterative decoding process, and outputs the subtraction result to the interleaver 1619. The check node decoder 1627 connects the check nodes according to a parity check matrix previously set in the decoding apparatus for the semi-systematic block LDPC code, and performs an update operation on a number of input values and output values equal to the number of 1s connected to the check nodes. The number of 1s connected to the check nodes is equal to a weight of each of rows in the parity check matrix. Therefore, an internal operation of the check node decoder 1627 is different according to a weight of each of the rows constituting the parity check matrix.

The interleaver 1619, under the control of the controller 1621, interleaves the signal output from the adder 1625 according to a predetermined interleaving scheme, and outputs the interleaved signal to the adder 1615 and the variable node decoder 1611. As the memory 1623 stores only the mother matrix capable of generating the semi-systematic block LDPC code, the controller 1621 reads the mother matrix stored in the memory 1623 and generates exponents of permutation matrices constituting a corresponding child matrix using a size $N_s{}'$ of a permutation matrix corresponding to a predetermined block size. In addition, the controller 1621 controls an interleaving scheme of the interleaver 1619 and a deinterleaving scheme of the deinterleaver 1617 using the generated child matrix. Similarly, if the decoding process is an initial decoding process, it should be regarded that the output signal of the deinterleaver 1617 is 0.

By iteratively performing the foregoing processes, the decoding apparatus performs error-free reliable decoding.

After the iterative decoding is performed a predetermined number of times, the switch 1614 switches off a connection between the variable node decoder 1611 and the adder 1615, and the switches 1613 switches on a connection between the variable node decoder 1611 and the hard decider 1629 to provide the signal output from the variable node decoder 1611 to the hard decider 1629. The hard decider 1629 performs a hard decision on the signal output from the variable node decoder 1611, and outputs the hard decision result, and the output value of the hard decider 1629 becomes a finally decoded value.

As can be appreciated from the foregoing description, the present invention provides a semi-systematic block LDPC code of which a minimum cycle length is maximized in a mobile communication system, thereby maximizing an error correction capability. Therefore, the decoding apparatus can correctly decode received data using the semi-systematic block LDPC code, securing reliable decoding. In addition, the present invention generates an efficient parity check matrix, thereby minimizing coding complexity of a semi-systematic block LDPC code whose complexity can be controlled according to a block size.

That is, the present invention proposes a semi-systematic block LDPC code to secure high performance by applying iterative decoding in a factor graph. In addition, the present invention creates a parity check matrix of a semi-systematic block LDPC code block-by-block, thereby enabling implementation of a decoder with minimum decoding complexity, improved in terms of the decoding speed. In particular, the present invention provides a semi-systematic block LDPC code in which an information word part having a relatively high reliability is not transmitted and single parity check matrices are concatenated, making it possible to acquire a higher error correction capability using a code having a larger block size and a lower coding rate.

In addition, when a full lower triangular matrix is mapped to a particular part of the parity check matrix, the present invention can generate a semi-systematic block LDPC code by concatenating only a relatively simple single parity check matrix to a structure of the general block LDPC code.

Moreover, the present invention adjusts coding complexity of a semi-systematic block LDPC code having a variable size in proportion to the block size, enabling efficient coding. In particular, the present invention generates a semi-systematic block LDPC code, which is applicable to various coding rates and has various block sizes, thereby contributing to the minimization of hardware complexity.

While the present invention has been shown and described with reference to certain preferred embodiments thereof, it will be understood by those skilled in the art that various changes in form and details may be made therein without departing from the spirit and scope of the present invention as defined by the appended claims.

What is claimed is:

1. A method for coding a semi-systematic block low-density parity check (LDPC) code, the method comprising the steps of:

receiving an information word;

coding the information word into a codeword including the information word, a first parity, a second parity, and a third parity, based on one of a first parity check matrix and a second parity check matrix, depending on a size to be applied when generating the information word into the semi-systematic block LDPC code;

puncturing a part having a degree being at least equal to a predetermined degree from the information word; and generating the semi-systematic block LDPC code including the information word, a part of which being punctured, the first parity, the second parity, and the third parity.

2. The method of claim 1, further comprising the steps of:

modulating the semi-systematic block LDPC code into a modulated symbol using a predetermined modulation scheme; and transmitting the modulated symbol.

3. The method of claim 1, wherein the second parity check matrix is a parity check matrix defined by varying a size of the first parity check matrix.

4. The method of claim 3, wherein the first parity check matrix is a parity check matrix generated such that the semi-systematic block LDPC code has a predetermined size and a predetermined coding rate.

5. The method of claim 4, wherein the first parity check matrix includes a predetermined number of partial blocks, and each of the partial blocks has a predetermined size.

6. The method of claim 5, wherein the second parity check matrix is defined by varying a size of the partial blocks of the first parity check matrix.

7. The method of claim 6, wherein a predetermined permutation matrix is mapped to each of predetermined partial blocks from among the partial blocks on a one-to-one basis.

8. The method of claim 7, wherein the second parity check matrix is a parity check matrix generated by determining exponents of the permutation matrices of the second parity check matrix according to exponents of the permutation matrices of the first parity check matrix and a size of partial blocks of the second parity check matrix.

9. The method of claim 8, wherein the second parity check matrix has a relation defined by $a_i' = a_i \bmod N_s'$ (for $1 \leq i \leq L$)

where $a_1, a_2, \ldots, a_L$ denote exponents of L permutation matrices among permutation matrices of the first parity check matrix, $N_s \times N_s (N_s)$ denotes a size of partial blocks of the first parity check matrix, $a_1', a_2', \ldots, a_L'$ denote exponents of L permutation matrices among permutation matrices of the second parity check matrix, $N_s' \times N_s' (N_s')$ denotes a size of partial blocks of the second parity check matrix, and 'mod' denotes a modulo operation.

10. The method of claim 9, wherein the step of coding the information word into the codeword comprises the steps of:

determining one of the first parity check matrix and the second parity check matrix according to the size;

classifying partial blocks of the determined parity check matrix into a first part and a second part;

generating a first signal by multiplying the information word by a first partial matrix of the first part;

generating a second signal by multiplying the information word by a second partial matrix of the first part;

generating a third signal by multiplying the first signal by a matrix multiplication of a third partial matrix and an inverse matrix of a fourth partial matrix of the first part;

generating a fourth signal by adding the second signal to the third signal, the fourth signal being the first parity;

generating a fifth signal by multiplying the fourth signal by a fifth partial matrix of the first part;

generating a sixth signal by adding the second signal to the fifth signal;

generating the second parity by multiplying the sixth signal by the inverse matrix of the fourth partial matrix of the first part;

generating the third parity by coding the information word according to the second part; and generating the codeword including the information word, the first parity, the second parity, and the third parity.

11. The method of claim 10, wherein the first partial matrix and the second partial matrix are partial matrices mapped to an information part associated with the information word in the determined parity check matrix.

12. The method of claim 11, wherein the third partial matrix and the fourth partial matrix are partial matrices mapped to a first parity part associated with a parity, and the fifth partial matrix and the sixth partial matrix are partial matrices mapped to a second parity part associated with the parity.

13. The method of claim 12, wherein one of the first parity check matrix and the second parity check matrix includes an information part mapped to the information word, a first parity part mapped to a first parity, a second parity part mapped to a second parity, and a third parity part mapped to a third parity, the first to third parities depending on the information word, wherein the information part includes a third part including partial blocks having an information word connected to variable nodes having a degree being at least equal to the predetermined degree in a factor graph among the partial blocks classified into the information part and a fourth part including partial blocks having an information word not connected to the variable nodes having the degree being at least equal to the predetermined degree, and wherein the second part includes the fifth partial matrix and the sixth partial matrix.

14. The method of claim 13, wherein the fifth partial matrix includes permutation matrices arranged in a full lower triangular form.

15. The method of claim 14, wherein the permutation matrices arranged in the full lower triangular form are identity matrices.

16. The method of claim 15, wherein the permutation matrices are arranged in each of predetermined partial blocks among the partial blocks classified into the third part and the fourth part, such that a minimum cycle length in a factor graph of the semi-systematic block LDPC code becomes a predetermined length and a weight is irregular.

17. The method of claim 16, wherein if a coding rate to be applied when generating the information word into the semi-systematic block LDPC code is 1/2, a size of the semi-systematic block LDPC code is $24N_s$, and a size of the information word is $12N_s$, the first parity check matrix is expressed as where blocks represent the partial blocks, numbers represent exponents of corresponding permutation matrices, blocks with no number represent partial blocks to which zero matrices are mapped, and $N_s$ represents a size of the partial blocks.

18. An apparatus for coding a semi-systematic block low density parity check (LDPC) code, the apparatus comprising:
a semi-systematic block LDPC encoder for coding an information word into a codeword including the information word, a first parity, a second parity, and a third parity, based on one of a first parity check matrix and a second parity check matrix, depending on a size to be applied when generating the information word into a semi-systematic block LDPC code, puncturing a part having a degree being at least equal to a predetermined degree from the information word, and generating the semi-systematic block LDPC code including the information word, a part of which being punctured, the first parity, the second parity, and the third parity;
a modulator for modulating the semi-systematic block LDPC code into a modulated symbol using a predetermined modulation scheme; and
a transmitter for transmitting the modulated symbol.

19. The apparatus of claim 18, wherein the second parity check matrix defined by varying a size of the first parity check matrix.

20. The apparatus of claim 19, wherein the first parity check matrix is generated such that the semi-systematic block LDPC code has a predetermined size and a predetermined coding rate.

21. The apparatus of claim 20, wherein the first parity check matrix comprises:
a predetermined number of partial blocks,
wherein each of the partial blocks has a predetermined size.

22. The apparatus of claim 21, wherein the second parity check matrix is defined by varying a size of the partial blocks of the first parity check matrix.

23. The apparatus of claim 22, wherein a predetermined permutation matrix is mapped to each of predetermined partial blocks among the partial blocks on a one-to-one basis.

24. The apparatus of claim 23, wherein the second parity check matrix is generated by determining exponents of the permutation matrices of the second parity check matrix according to exponents of the permutation matrices of the first parity check matrix and a size of partial blocks of the second parity check matrix.

25. The apparatus of claim 24, wherein the second parity check matrix has a relation defined by $a_i' = a_i \bmod N_s'$ (for $1 \leq i \leq L$)

where $a_1, a_2, \ldots, a_L$ denote exponents of L permutation matrices among permutation matrices of the first parity check matrix, $N_s \times N_s (N_s)$ denotes a size of partial blocks of the first parity check matrix, $a_1', a_2', \ldots, a_L'$ denote exponents of L permutation matrices among permutation matrices of the second parity check matrix, $N_s' \times N_s' (N_s')$ denotes a size of partial blocks of the second parity check matrix, and 'mod' denotes a modulo operation.

26. The apparatus of claim 25, wherein the semi-systematic block LDPC encoder comprises:
a controller for determining one of the first parity check matrix and the second parity check matrix, and controlling the information word such that a part having a degree being at least equal to the predetermined degree is punctured according to the coding rate;
a first matrix multiplier for multiplying the information word by a first partial matrix of a first part including particular partial blocks from among the partial blocks of the determined parity check matrix;
a second matrix multiplier for multiplying the information word by a second partial matrix of the first part;
a third matrix multiplier for multiplying a signal output from the first matrix multiplier by a matrix multiplication of a third partial matrix and an inverse matrix of a fourth partial matrix of the first part;
a first adder for generating the first parity by adding a signal output from the second matrix multiplier to a signal output from the third matrix multiplier;
a fourth matrix multiplier for multiplying a signal output from the first adder by a fifth partial matrix of the first part;
a second adder for adding a signal output from the second matrix multiplier to a signal output from the fourth matrix multiplier;
a fifth matrix multiplier for generating the second parity by multiplying a signal output from the second adder by the inverse matrix of the fourth partial matrix of the first part;
an encoder for generating the third parity by coding the information word according to a second part including partial blocks, except for the partial blocks of the first part, in the determined parity check matrix; and
a puncturer for puncturing a part having a degree being at least equal to the predetermined degree from the information word according to a control signal from the controller; and
a plurality of switches for outputting the semi-systematic block LDPC code by switching the information word, the part of which being punctured, the first parity, the second parity, and the third parity according to the coding rate.

27. The apparatus of claim 26, wherein the first partial matrix and the second partial matrix are mapped to an information part associated with the information word in the determined parity check matrix.

28. The apparatus of claim 27, wherein the third partial matrix and the fourth partial matrix are mapped to a first parity part associated with a parity, and
wherein the fifth partial matrix and the sixth partial matrix are mapped to a second parity part associated with the parity.

29. The apparatus of claim 28, wherein at least one of the first parity check matrix and the second parity check matrix comprises:
an information part mapped to the information word;
a first parity part mapped to a first parity;
a second parity part mapped to a second parity; and
a third parity part mapped to a third parity, all of the first to third parities depending on the information word,
wherein the information part includes a third part including partial blocks having an information word connected to variable nodes having a degree being higher than or equal to the predetermined degree in a factor graph among the partial blocks classified into the information part and a fourth part including partial blocks having an information word not connected to the variable nodes having the degree being higher than or equal to the predetermined degree, and the second part includes the fifth partial matrix and the sixth partial matrix.

30. The apparatus of claim 29, wherein the fifth partial matrix is a matrix comprising permutation matrices arranged in a full lower triangular form.

31. The apparatus of claim 30, wherein the permutation matrices arranged in the full lower triangular form are identity matrices.

32. The apparatus of claim 31, wherein the permutation matrices are arranged in each of predetermined partial blocks among the partial blocks classified into the third part and the fourth part, such that a minimum cycle length in a factor graph of the semi-systematic block LDPC code becomes a predetermined length and a weight is irregular.

33. The apparatus of claim 32, wherein if a coding rate to be applied when generating the information word into the semi-systematic block LDPC code is 1/2, a size of the semi-systematic block LDPC code is $24N_s$, and a size of the information word is $12N_s$, the first parity check matrix is expressed as where blocks represent the partial blocks, numbers represent exponents of corresponding permutation matrices, blocks with no number represent partial blocks to which zero matrices are mapped, and $N_s$ represents a size of the partial blocks.

34. A method for decoding a semi-systematic block low-density parity check (LDPC) code, the method comprising the steps of:
receiving a signal;
inserting '0' into the received signal according to a control signal;
determining one of a first parity check matrix and a second parity check matrix according to a size of a semi-systematic block LDPC code to be decoded; and
detecting the semi-systematic block LDPC code by decoding the received 0-inserted signal according to the determined parity check matrix.

35. The method of claim 34, wherein the second parity check matrix is defined by varying a size of the first parity check matrix.

36. The method of claim 35, wherein the first parity check matrix is generated such that the semi-systematic block LDPC code has a predetermined size and a predetermined coding rate.

37. The method of claim 36, wherein the first parity check matrix includes a predetermined number of partial blocks, and each of the partial blocks has a predetermined size.

38. The method of claim 37, wherein the second parity check matrix is defined by varying a size of the partial blocks of the first parity check matrix.

39. The method of claim 38, wherein a predetermined permutation matrix is mapped to each of the partial blocks on a one-to-one basis.

40. The method of claim 39, wherein the second parity check matrix is generated by determining exponents of the permutation matrices of the second parity check matrix according to exponents of the permutation of the first parity check matrix and a size of partial blocks of the second parity check matrix.

41. The method of claim 40, wherein the second parity check matrix has a relation defined by $$a_i' = a_i \bmod N_s' \text{ (for } 1 \leq i \leq L)$$

where $a_1, a_2, \ldots, a_L$ denote exponents of L permutation matrices from among permutation matrices of the first parity check matrix, $N_s \times N_s(N_s)$ denotes a size of partial blocks of the first parity check matrix, $a_1', a_2', \ldots, a_L'$ denote exponents of L permutation matrices among permutation matrices of the second parity check matrix, $N_s' \times N_s'(N_s')$ denotes a size of partial blocks of the second parity check matrix, and 'mod' denotes a modulo operation.

42. The method of claim 41, wherein the step of detecting the semi-systematic block LDPC code by decoding the received 0-inserted signal according to the determined parity check matrix comprises the steps of:
determining a deinterleaving scheme and an interleaving scheme according to the determined parity check matrix;
detecting probability values of the received 0-inserted signal;
generating a first signal by subtracting a signal generated in a previous decoding process from the probability values of the received 0-inserted signal;
deinterleaving the first signal using the deinterleaving scheme;
detecting probability values from the deinterleaved signal;
generating a second signal by subtracting the deinterleaved signal from probability values of the deinterleaved signal; and
detecting the semi-systematic block LDPC code by interleaving the second signal using the interleaving scheme and iteratively decoding the interleaved signal.

43. The method of claim 42, wherein if a coding rate is 1/2, a size of the semi-systematic block LDPC code is $24N_s$, and a size of an information word of the semi-systematic block LDPC code is $12N_s$, the first parity check matrix is expressed as where blocks represent the partial blocks, numbers represent exponents of corresponding permutation matrices, blocks with no number represent partial blocks to which zero matrices are mapped, and $N_s$ represents a size of the partial blocks.

44. An apparatus for decoding a semi-systematic block low density parity check (LDPC) code, the apparatus comprising:
   a receiver for receiving a signal, and inserting '0' into the received signal according to a control signal; and
   a decoder for detecting the semi-systematic block LDPC code by determining one of a first parity check matrix and a second parity check matrix according to a size of a semi-systematic block LDPC code to be decoded, and decoding the received 0-inserted signal according to the determined parity check matrix.

45. The apparatus of claim 44, wherein the second parity check matrix is defined by varying a size of the first parity check matrix.

46. The apparatus of claim 45, wherein the first parity check matrix is generated such that the semi-systematic block LDPC code has a predetermined size and a predetermined coding rate.

47. The apparatus of claim 46, wherein the first parity check matrix includes a predetermined number of partial blocks, and each of the partial blocks has a predetermined size.

48. The apparatus of claim 47, wherein the second parity check matrix is defined by varying a size of the partial blocks of the first parity check matrix.

49. The apparatus of claim 48, wherein a predetermined permutation matrix is mapped to each of the partial blocks on a one-to-one basis.

50. The apparatus of claim 49, wherein the second parity check matrix is generated by determining exponents of the permutation matrices of the second parity check matrix according to exponents of the permutation of the first parity check matrix and a size of partial blocks of the second parity check matrix.

51. The apparatus of claim 50, wherein the second parity check matrix has a relation defined by $$a_i' = a_i \bmod N_s' (\text{for } 1 \leq i \leq L)$$

where $a_1, a_2, \ldots, a_L$ denote exponents of L permutation matrices among permutation matrices of the first parity check matrix, $N_s \times N_s (N_s)$ denotes a size of partial blocks of the first parity check matrix, $a_1', a_2', \ldots, a_L'$ denote exponents of L permutation matrices among permutation matrices of the second parity check matrix, $N_s' \times N_s' (N_s')$ denotes a size of partial blocks of the second parity check matrix, and 'mod' denotes a modulo operation.

52. The apparatus of claim 51, wherein the decoder comprises:
   a controller for determining one of the first parity check matrix and the second parity check matrix according to the size of the semi-systematic block LDPC code to be decoded, and controlling a deinterleaving scheme and an interleaving scheme according to the determined parity check matrix;
   a variable node decoder for detecting probability values of the received 0-inserted signal by connecting variable nodes according to a weight of each of columns in the determined parity check matrix;
   a first adder for subtracting a signal generated in a previous decoding process from an output signal of the variable node decoder;
   a deinterleaver for deinterleaving a signal output from the first adder using the deinterleaving scheme determined according to the determined parity check matrix;
   a check node decoder for detecting probability values of a signal output from the deinterleaver by connecting check nodes according to a weight of each of rows in the determined parity check matrix;
   a second adder for subtracting an output signal of the deinterleaver from an output signal of the check node decoder; and
   an interleaver for interleaving a signal output from the second adder using the interleaving scheme determined according to the determined parity check matrix, and outputting the interleaved signal to the variable node decoder and the first adder.

53. The apparatus of claim 52, wherein if a coding rate is 1/2, a size of the semi-systematic block LDPC code is $24N_s$, and a size of an information word of the semi-systematic block LDPC code is $12N_s$, the first parity check matrix is expressed as where blocks represent the partial blocks, numbers represent exponents of corresponding permutation matrices, blocks with no number represent partial blocks to which zero matrices are mapped, and N, represents a size of the partial blocks.

* * * * *